(12) United States Patent
Kato et al.

(10) Patent No.: US 7,536,066 B2
(45) Date of Patent: May 19, 2009

(54) SEMICONDUCTOR CHIP MODULE

(75) Inventors: Masayuki Kato, Kawasaki (JP);
Shigenori Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/019,058

(22) Filed: Jan. 24, 2008

(65) Prior Publication Data

US 2008/0118202 A1    May 22, 2008

Related U.S. Application Data

(63) Continuation of application No. PCT/JP2005/013588, filed on Jul. 25, 2005.

(51) Int. Cl.
*G02B 6/12*    (2006.01)
*G02F 1/295*    (2006.01)

(52) U.S. Cl. .................................. 385/14; 385/4; 385/8

(58) Field of Classification Search .................. 385/14, 385/37, 134, 50, 4, 8; 359/245
See application file for complete search history.

(56) References Cited

U.S. PATENT DOCUMENTS

| | | | | |
|---|---|---|---|---|
| 5,416,866 A | * | 5/1995 | Sahlen | 385/37 |
| 5,757,989 A | | 5/1998 | Yoshimura et al. | |
| 5,835,646 A | * | 11/1998 | Yoshimura et al. | 385/14 |
| 6,222,951 B1 | * | 4/2001 | Huang | 385/14 |
| 6,343,171 B1 | * | 1/2002 | Yoshimura et al. | 385/50 |
| 6,477,286 B1 | | 11/2002 | Ouchi | |
| 6,751,393 B2 | * | 6/2004 | Sugama et al. | 385/134 |
| 6,961,166 B2 | * | 11/2005 | Wooten et al. | 359/245 |
| 7,058,245 B2 | * | 6/2006 | Farahi | 385/14 |
| 7,171,065 B2 | * | 1/2007 | Lee et al. | 385/14 |
| 2004/0202397 A1 | | 10/2004 | Hatta et al. | |
| 2006/0210215 A1 | * | 9/2006 | Aoki et al. | 385/14 |

FOREIGN PATENT DOCUMENTS

JP    5-2116 A    1/1993

(Continued)

OTHER PUBLICATIONS

"Optoelectronic systems based on InGaAs-complementary-metal-oxide-semiconductor smart-pixel arrays and fre-space optical interconnects," by Walker et al, Applied Optics, vol. 37, No. 14, May 10, 1998, pp. 2822-2830.*

(Continued)

*Primary Examiner*—Frank G Font
*Assistant Examiner*—Robert Tavlykaev
(74) *Attorney, Agent, or Firm*—Westerman, Hattori, Daniels & Adrian, LLP.

(57)    ABSTRACT

In a semiconductor chip module, a transmission optical waveguide device to be mounted in the proximity of the side face of a semiconductor chip on a circuit board includes an input optical waveguide to which light from an external light source is inputted, an output optical waveguide provided at a position displaced in a vertical direction to the surface of the circuit board in a mounted state on the circuit with respect to the input optical waveguide for outputting an optical signal to a different device, an optical path changeover structure for guiding light guided through the input optical waveguide to the output optical waveguide, and an optical modulator provided on the input optical waveguide or the output optical waveguide for modulating light from the external light source based on an electric signal from the semiconductor chip.

18 Claims, 16 Drawing Sheets

| | FOREIGN PATENT DOCUMENTS | | |
|---|---|---|---|
| JP | 6-69490 | A | 3/1994 |
| JP | 8-94328 | A | 4/1996 |
| JP | 9-15545 | A | 1/1997 |
| JP | 2000-250671 | A | 9/2000 |
| JP | 2001-36197 | A | 2/2001 |
| JP | 2001-133666 | A | 5/2001 |
| JP | 2001-197006 | A | 7/2001 |
| JP | 2004-109457 | A | 4/2004 |
| JP | 2004-317556 | A | 11/2004 |
| WO | 9406052 | A1 | 3/1994 |

OTHER PUBLICATIONS

Q. Xing et al. "Coupling between Stacked Waveguides Using Grating Couplers"; Transactions of The Institute of Electronics, Information and Communication Engineers C-I, vol. J80-C-I, No. 10, pp. 461-468.

International Search Report of PCT/JP2005/013588, date of mailing Nov. 1, 2005.

* cited by examiner

FROM EXTERNAL LIGHT SOURCE

TO DIFFERENT DEVICE

SEMICONDUCTOR CHIP MODULE

CROSS REFERENCE TO RELATED APPLICATION(S)

This application is based on and hereby claims priority to PCT International Application No. PCT/JP2005/013588 filed on Jul. 25, 2005, in Japan, the contents of which are hereby incorporated by the reference.

TECHNICAL FIELD

This embodiment relates to a mounting technique for implementing large-capacity high-speed signal transmission, for example, between LSIs (Large Scale Integrated circuits) of an IT (Information Technology) equipment, and particularly to a semiconductor chip module suitable for use with an photoelectrical wiring structure (for example, an optical wiring LSI module) for implementing high-speed signal transmission between LSIs using light.

BACKGROUND

In recent years, a transmission bandwidth used for data communication is increasing steadily and increase of the speed and the capacity is advancing.

At present, for an interconnection where the transmission distance is several tens meters or more such as, for example, an interconnection between housings of servers, an optical link (data transmission using an optical fiber) which uses a wide transmission band and is less likely to undergo disturbance is utilized.

On the other hand, as the performance of an LSI such as, for example, a CPU, a memory (for example, a DRAM) and so forth increases and the processing speed increases, expansion of the transmission bandwidth in an information equipment such as, for example, a server has become required in order to implement an optical interconnection for carrying out high-speed signal transmission between LSIs.

Conventionally, in order to carry out high-speed large-capacity signal transmission (data transfer) between a CPU and a memory (here, a DRAM), for example, as shown in FIG. 15(A), a CPU 102 is mounted on a system board 100 (hereinafter referred to simply as board) of a server through a package board 101 and a plurality of memories 103 (here, DRAMs) are mounted in the proximity of the package board 101 on the board 100.

In this instance, as shown in FIG. 15(B) [schematic sectional view taken along line X-X' of FIG. 15(A)], the CPU 102 and the DRAMs 103 are connected to each other by multi-layer electric wirings 104 formed in the board 100.

In such a configuration as just described, in order to drastically enlarge the transmission bandwidth between the CPU 102 and the memories 103, it is necessary to increase the transmission speed in a single wiring and increase the number of wirings.

It is to be noted that Patent Documents 1 to 7 specified hereinbelow were obtained as a result of a prior art search conducted regarding an optical interconnection or an optical modulator.

In Patent Document 1, a structure is disclosed wherein a reflection structure and a controlling electrode are provided at an end portion of an optical waveguide and an optical path is folded back in a small size and at low loss (refer, for example, to FIG. 2). In particular, an example wherein the structure is applied to a directional coupler is disclosed.

In Patent Document 2, an interface configuration is disclosed wherein, in order to carry out high-speed data transfer, an optical signal is produced from an electric signal by an optical modulator using an electro-optic effect (refer, for example, to FIG. 1).

In Patent Document 3, a configuration wherein an optical signal which propagates in an optical waveguide substrate is emitted to the outside of the substrate so as to be connected to an optical fiber (refer, for example, to FIG. 4) and a configuration wherein, in a multi-layer optical waveguide structure, refractive index variation (electro-optic effect) generated by voltage application is utilized to switch an optical signal between upper and lower layers are disclosed (refer, for example, to FIG. 13).

In Patent Document 4, a configuration is disclosed wherein, regarding a distortion measuring instrument which involves detection of a wavelength variation, a Bragg reflection type waveguide is used as a reflection structure in an optical circuit configuration which uses an optical waveguide (refer, for example, to FIG. 2).

In Patent Document 5, a configuration is disclosed wherein, as a photoelectric integration device, an LSI, an optical device, a driving circuit for controlling the optical device and wiring means (optical waveguide) to the optical device are accommodated in the same package (refer, for example, to FIG. 1).

In Patent Document 6, a configuration is disclosed wherein a reflection type optical modulator is used in a wavelength division multiplexing network (refer, for example, to FIG. 17).

In Patent Document 7, a waveguide type optical modulator (in particular, a Mach-Zehnder type optical modulator) for which an organic-based electro-optical material is used is disclosed (refer, for example, to FIG. 1).

Patent Document 1: Japanese Patent Laid-Open No. Hei 5-2116

Patent Document 2: Japanese Patent Laid-Open No. 2000-250671

Patent Document 3: Japanese Patent Laid-Open No. Hei 6-69490

Patent Document 4: Japanese Patent Laid-Open No. Hei 8-94328

Patent Document 5: Japanese Patent Laid-Open No. 2001-36197

Patent Document 6: Japanese Patent Laid-Open No. 2001-197006

Patent Document 7: Japanese Patent Laid-Open No. 2004-109457

SUMMARY

The embodiment provides that a semiconductor chip module comprises a semiconductor chip mounted on a circuit board, and a transmission optical waveguide device for transmitting a light signal obtained by modulating light from an external light source to a different device, the transmission optical waveguide device including an input optical waveguide to which the light from the external light source is inputted, an output optical waveguide, provided at a position displaced in a direction perpendicular to the surface of the circuit board in a mounted state on the circuit board with respect to the input optical waveguide, outputting an optical signal to the different device, an optical path changeover structure for guiding the light guided through the input optical waveguide to the output optical waveguide, and an optical modulator, provided at the input optical waveguide or the output optical waveguide, modulating the light from the external light source based on an electric signal from the semiconductor chip.

DESCRIPTION OF THE EMBODIMENTS

In an electric wiring by such a circuit board 100 used for connection between the CPU 102 and memories (here, DRAMs) 103 (connection between LSIs) as described above, if the transmission speed exceeds several GHz, then waveform rounding and attenuation increase remarkably.

In this instance, if a pre-emphasis or equalizing technique is combined with a differential transmission method to carry out waveform shaping and amplification, then although electric wiring can be ready for a somewhat high frequency, electric power necessary for signal transmission between LSIs increases. Further, if the wiring length between LSIs increases on an account of mounting, achievement of such a countermeasure as described above becomes very difficult. Further, if the number of wirings increases, then electromagnetic interference between wirings arising from increase of the frequency becomes a problem.

As one of methods for solving the subjects arising from such electric wiring as described above, an optical interconnection configuration which uses light which allows high-speed transmission and is free from mutual interference may be considered available.

Figure 16:
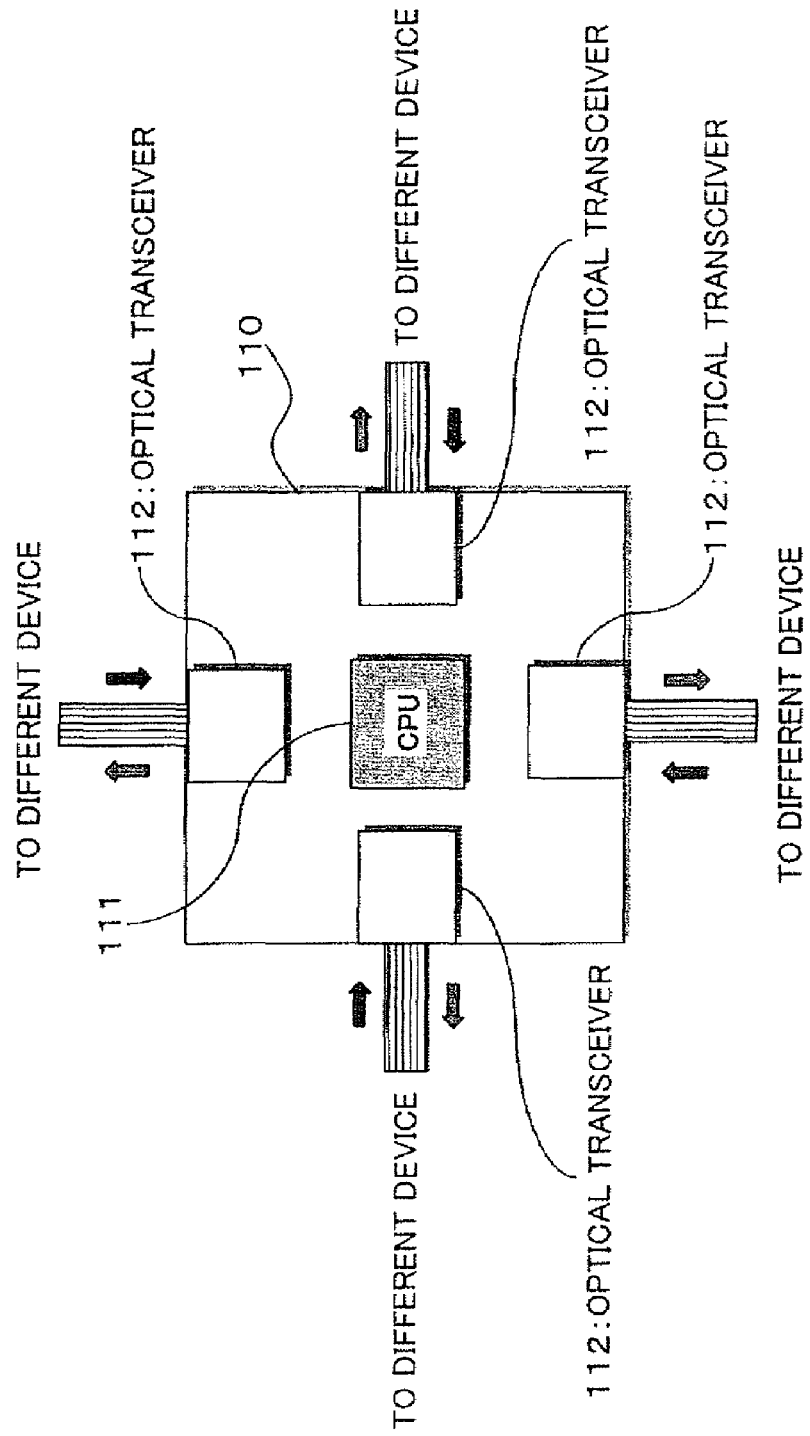
FIG. 16 is a schematic view showing an example of a configuration of an optical interconnection between semiconductor chips.

For example, where an optical interconnection configuration is applied to connection between a CPU and a different device (including an LSI such as a memory), it seems a possible idea to mount, as shown in FIG. 16, a CPU 111 on a board 110 and mount a plurality of optical transceivers 112 in the proximity of the CPU 111 while the optical transceivers 112 and different devices (not shown) are connected, for example, through a multi-core optical fiber or optical waveguide.

In this instance, each optical transceiver 112 is considered as a device which is configured integrally from a light source for converting an electric signal to be transmitted from the CPU 111 to a different device into an optical signal, a photodetector for converting an optical signal transmitted from the different device to the CPU 111 into an electric signal, and a driving control circuit for driving and controlling the light source and the photodetector.

While such an optical interconnection configuration as described above can be implemented technically, an increased cost is required when the optical interconnection configuration is commercialized actually.

Further, such an optical interconnection configuration as described above increases the size. Actually, the CPU 111 is mounted not directly on the board (system board) 110 by soldering as described above but through a package board in order to adjust the connection pitch. Therefore, the size of the package board increases, and a mounting area greater by the size of the package board becomes required. Further, also a heat radiation fin (not shown) of the CPU is required, and also a mounting area for the heat radiation fin is required.

In this connection, as regards the size, it is considered possible to achieve an equal level in terms of the area to a conventionally available level if a small-size optical transceiver is produced. However, as regards the cost, if a light source and a photodetector are provided for each of wirings, then the cost increases incomparably, and therefore, it is a current situation that the optical interconnection configuration is not placed in practical use.

It is to be noted that, as regards an optical interconnection, also a method has been proposed which uses an interposer wherein an optical device is incorporated between an LSI and a package board (refer, for example, to Patent Document 5 mentioned hereinabove)

However, since terminals of several thousand pins exist at a board mounting portion of an LSI, it is not a good policy to dispose optical wirings for an optical device, an optical waveguide and so forth just under a chip.

Incidentally, in the field of study of silicon photonics, as a method for solving the subject that the cost for the optical interconnection is high, it is studied to form a light source or a photodetector in the inside of a silicon LSI, and it is estimated that, if this is implemented, then remarkable cost reduction of the optical interconnection is implemented and the method can be applied also to transmission for a shorter distance.

However, at the present point of time, direct modulation exceeding 10 Gbps is not achieved and a good prospect for practical implementation is not obtained. Even if such direct modulation is achieved, since the direct modulation of a semiconductor laser requires time of hundred picoseconds or more for a rising edge of light emission, it is estimated that the delay time becomes a problem, for example, in transmission between a CPU and a memory. In this connection, it is estimated actually difficult to place the technique disclosed in Patent Document 5 described above into practical use.

On the other hand, also it seems a possible idea to adopt a method wherein light from a common light source provided externally is divided into a plurality of light beams and then the light beams are modulated individually by external modulators to produce optical signals (refer, for example, to Patent Document 2 mentioned hereinabove).

However, since conventional external modulators have been developed for application to communication apparatus, external modulators of a form wherein they can be disposed in the proximity of an LSI and mounted in a large quantity and in a high density. Accordingly, some contrivance is required in order to apply a conventional optical modulator to the optical interconnection.

The embodiment provides that a semiconductor chip module comprises a semiconductor chip mounted on a circuit board, and a transmission optical waveguide device for transmitting a light signal obtained by modulating light from an external light source to a different device, the transmission optical waveguide device including an input optical waveguide to which the light from the external light source is inputted, an output optical waveguide, provided at a position displaced in a direction perpendicular to the surface of the circuit board in a mounted state on the circuit board with respect to the input optical waveguide, outputting an optical signal to the different device, an optical path changeover structure for guiding the light guided through the input optical waveguide to the output optical waveguide, and an optical modulator, provided at the input optical waveguide or the output optical waveguide, modulating the light from the external light source based on an electric signal from the semiconductor chip.

Particularly, preferably the semiconductor chip module is configured such that the input optical waveguide and the output optical waveguide extend to an end face of the transmission optical waveguide device on the semiconductor chip side, and the optical path changeover structure includes a light reflection surface of the end face of the transmission optical waveguide device, an inclination waveguide portion of the input optical waveguide and an inclination waveguide portion of the output optical waveguide connected to the inclination waveguide portion of the input optical waveguide through the light reflection surface, and is configured such that the light guided through the inclination waveguide portion of the input optical waveguide is reflected on the light reflection surface and is guided to the inclination waveguide portion of the output optical waveguide.

It is to be noted that the semiconductor chip module may be configured such that the optical path changeover structure includes a grating coupler provided in the proximity of an end face of the transmission optical waveguide device on the semiconductor chip side on the input optical waveguide and the output optical waveguide, and is configured such that the light guided through the input optical waveguide is guided to the output optical waveguide by the grating coupler.

Preferably, the semiconductor chip module further comprises a reception optical waveguide device including a reception input optical waveguide guiding the optical signal from the different device to an end face thereof on the semiconductor chip side, and a photoelectric conversion device, mounted on the circuit board so as to be connected to the reception optical waveguide, converting the optical signal into an electric signal.

In this instance, preferably the semiconductor chip module is configured such that the reception optical waveguide device includes an optical waveguide for processing a reflection light, connected to the reception input optical waveguide, having a light absorption structure absorbing light reflected on the end face of the reception optical waveguide device. Further, preferably the reception optical waveguide device is provided at a position displaced in a direction perpendicular to the surface of the circuit board in a mounted state on the circuit board with respect to the reception input optical waveguide.

Here, preferably the transmission optical waveguide device and the reception optical waveguide device are provided in a juxtaposed relationship in a direction parallel to the surface of the circuit board.

Further, preferably the semiconductor chip module is configured such that the transmission optical waveguide device is comprised of a plurality of transmission optical waveguide devices, and the plural transmission optical waveguide devices are provided in a juxtaposed relationship in a direction parallel to the surface of the circuit board.

More preferably, the semiconductor chip module further comprises a common light source capable of supplying light individually to the plural transmission optical waveguide devices as the external light source.

Meanwhile, preferably the semiconductor chip module is configured such that the reception optical waveguide device is comprised of a plurality of reception optical waveguide devices, and the plural reception optical waveguide devices are provided in a juxtaposed relationship in a direction parallel to the surface of the circuit board.

Particularly, preferably the semiconductor chip module is configured such that the transmission optical waveguide device includes an electric wiring which extends from an electrode of the optical modulator to a bottom face of the transmission optical waveguide device in a mounted state on the circuit board and an electrode pad which is formed on the bottom face and to which the electric wiring is connected, and is connected to the electric wiring formed on the circuit board through the electrode pad so as to be electrically connected to the semiconductor chip.

Further, preferably the photoelectric conversion device is mounted on the circuit board through a wiring block having an electric wiring so as to be electrically connected to the semiconductor chip.

Further, preferably the optical modulator is formed from a material capable producing an electro-optical effect. Further, preferably the transmission optical waveguide device or the reception optical waveguide device is a polymer optical waveguide device.

A semiconductor chip module of the present invention comprises the semiconductor chip module as described above being comprised of a plurality of semiconductor chip modules, the plural semiconductor chip modules being connected to each other by an optical fiber.

Particularly, preferably the semiconductor chip module is configured such that the semiconductor chip is comprised of a plurality of semiconductor chips, the transmission optical waveguide device is comprised of a plurality of transmission optical waveguide devices, and the plural semiconductor chips and the transmission optical waveguide devices are provided on the circuit board.

Further, preferably the semiconductor chip module is configured such that the reception optical waveguide device is comprised of a plurality of reception optical waveguide devices, and the plural reception optical waveguide devices are provided on the circuit board.

EFFECT OF THE INVENTION

Accordingly, with the semiconductor chip module of the present invention, there is an advantage that a low-latency (low delay) optical interconnection whose size is reduced so that a great number of optical waveguide devices can be mounted in a high density in the proximity of a semiconductor chip (for example, an LSI) and which can carry out high-speed modulation can be implemented while the cost is suppressed low.

In the following, semiconductor chip modules according to embodiments of the present invention are described with reference to the drawings.

First Embodiment

First, a semiconductor chip module according to a first embodiment is described with reference to FIGS. 1 and 2.

Figure 1:
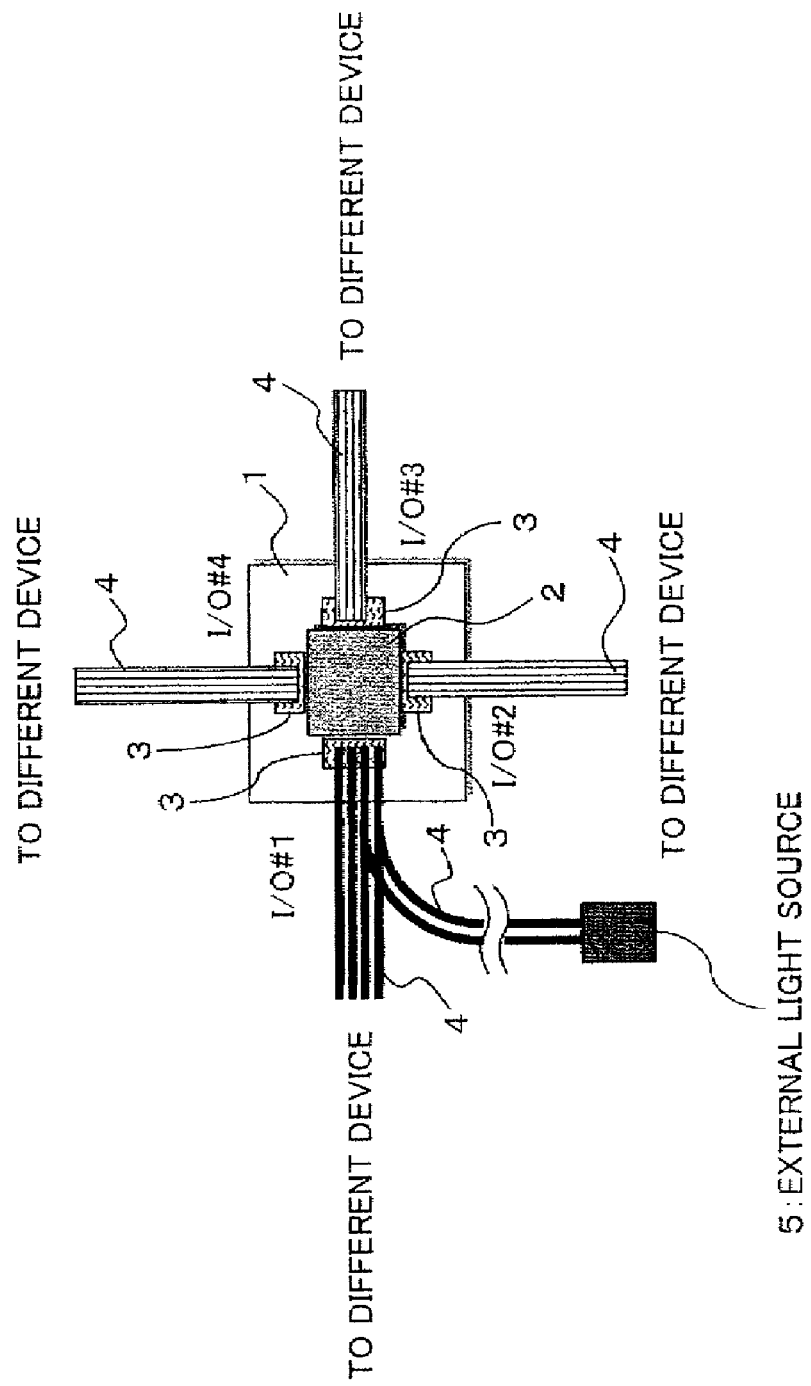
FIG. 1 is a schematic view showing a general configuration of a semiconductor chip module according to a first embodiment.

As shown in FIG. 1, the semiconductor chip module according to the present embodiment includes a semiconductor chip 2 mounted on a package board (circuit board) 1 and an optical transmission and reception device (inputting and outputting device) 3 mounted in the proximity of a side face of the semiconductor chip 2 on the package board 1 and including an optical waveguide device and a photoelectric conversion device.

The semiconductor chip module is connected to an external light source 5 and a different device (not shown; including a different system and a semiconductor chip) through an optical fiber 4 (for example, an optical fiber sheet).

It is to be noted here that an example of a configuration is shown wherein four optical transmission and reception devices 3 are mounted individually in the proximity of the side faces of the semiconductor chip 2 and are connected to four different devices (in FIG. 1, input and output portions are denoted individually by I/O#1, I/O#2, I/O#3, and I/O#4).

Here, the semiconductor chip 2 is an IC chip including an LSI such as, for example, a CPU or a memory (for example, a DRAM).

Figure 2:
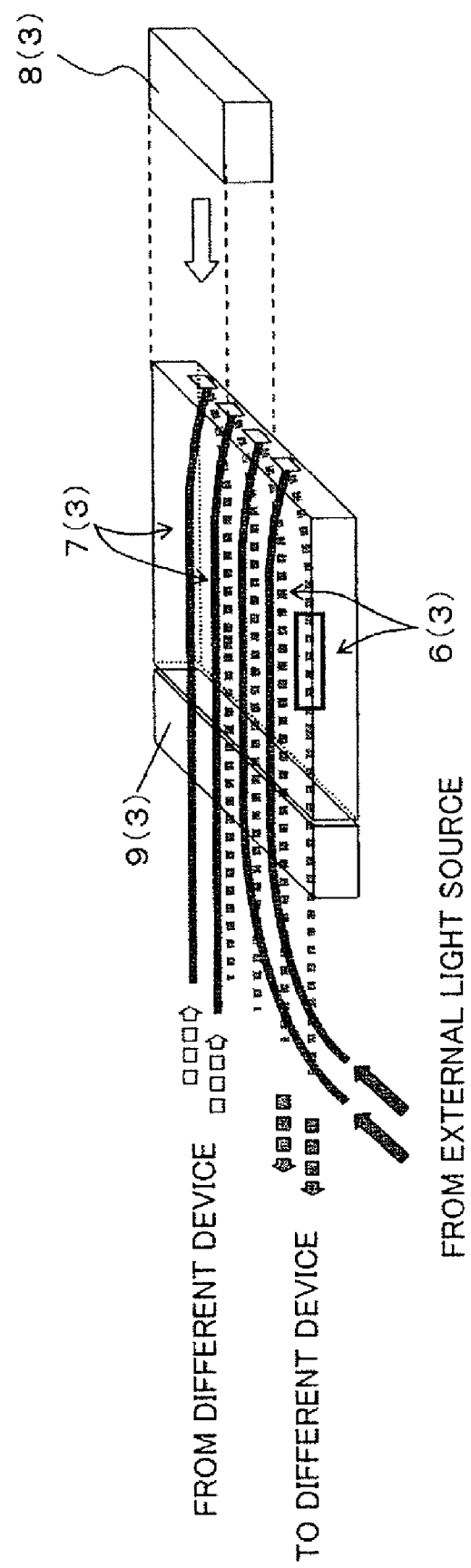
FIG. 2 is a schematic view showing a configuration of components mounted on the semiconductor chip module according to the first embodiment.

Further, as shown in FIG. 2, each optical transmission and reception device 3 is configured as a device which includes a plurality of (here, two) transmission optical waveguide devices 6, a plurality of (here, two) reception optical waveguide devices 7, a photoelectric conversion device 8, and an optical fiber connector 9.

Each of the transmission optical waveguide devices 6 is used for transmitting an optical signal obtained by modulating light from the external light source 5 provided externally to a different device. Here, the transmission optical waveguide device 6 is configured, for example, as a polymer optical waveguide device.

Figure 3A:
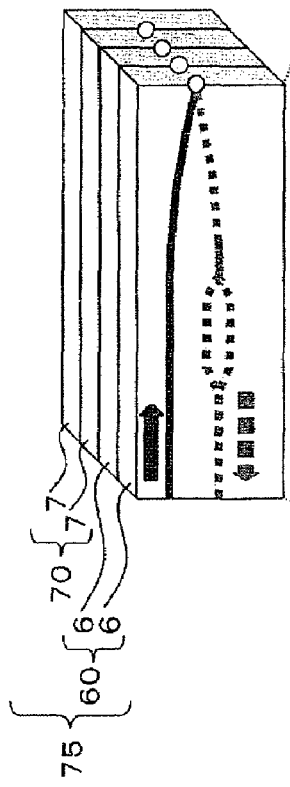
FIGS. 3(A) and 3(B) are schematic views showing a configuration of an optical waveguide device which composes the semiconductor chip module according to the first embodiment.
Figure 3B:
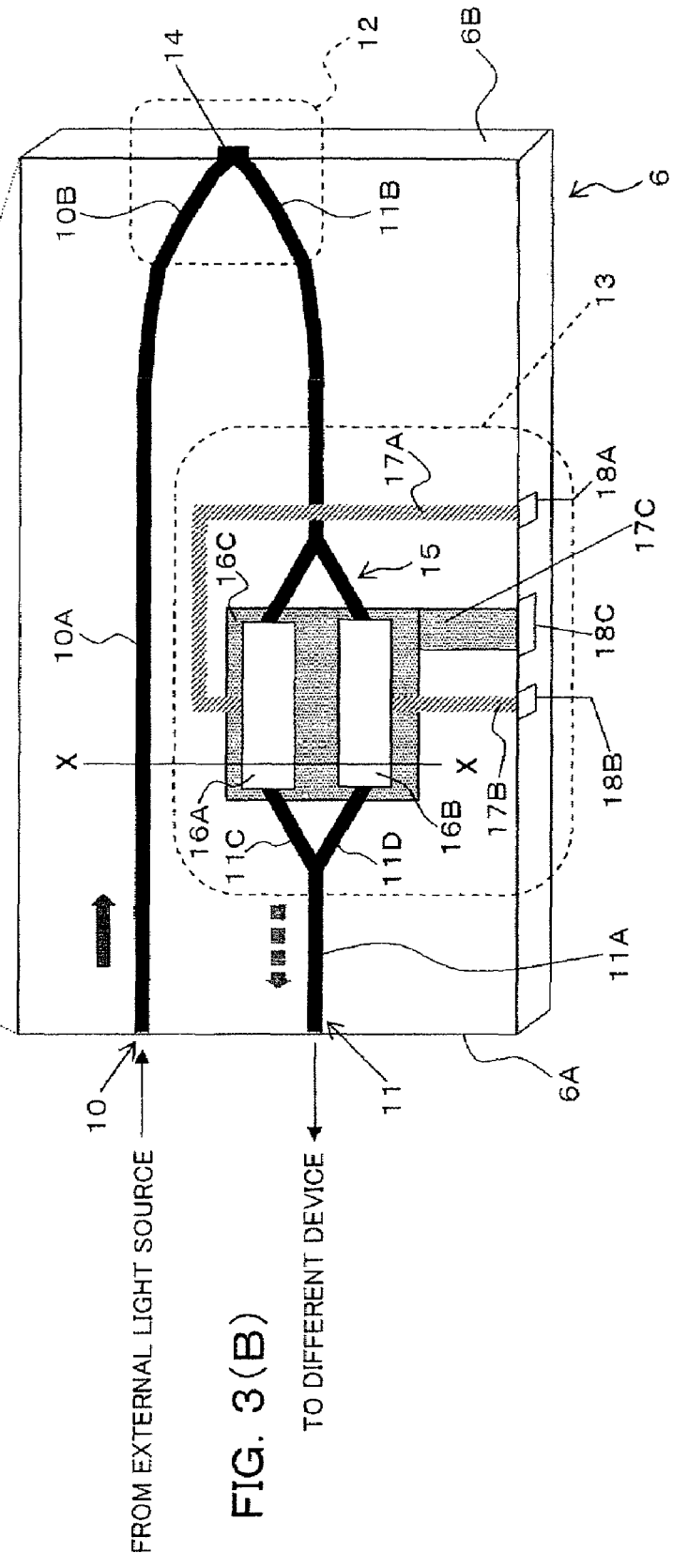

In the present embodiment, as shown in FIGS. 3(A) and 3(B), the transmission optical waveguide device 6 includes an input optical waveguide 10 to which light from the external light source 5 is inputted, an output optical waveguide 11 for outputting an optical signal to a different device, an optical path changeover structure 12 for guiding light guided through the input optical waveguide 10 to the output optical waveguide 11, and an optical modulator 13 provided on the output optical waveguide 11 for modulating light from the external light source 5 based on an electric signal from the semiconductor chip 2. Since the transmission optical waveguide device 6 includes the optical modulator 13, it is referred to also as optical modulation device.

It is to be noted that, in FIG. 3(A), reference numeral 60 denotes an optical wiring transmission array composed of a plurality of transmission optical waveguide devices 6 integrated with each other. Further, in FIG. 3(A), reference numeral 70 denotes an optical wiring reception array composed of a plurality of reception optical waveguide devices 7 integrated with each other. In FIG. 3(A), reference numeral 75 denotes an optical wiring transmission and reception array composed of a plurality of transmission optical waveguide devices 6 and a plurality of reception optical waveguide devices 7 integrated with each other.

Further, while, in order to simplify the description, two transmission optical waveguide devices 6 and two reception optical waveguide devices 7 are provided in FIGS. 2, 3(A) and 3(B), the number of optical waveguide devices is not limited to this.

Here, as shown in FIGS. 2, 3(A) and 3(B), both of the input optical waveguide 10 and the output optical waveguide 11 extend from a device end face 6A connected to the optical fiber connector 9 to a device end face 6B on the semiconductor chip 2 side.

Particularly, as shown in FIGS. 3(A) and 3(B), the output optical waveguide 11 is provided in parallel at a position (different position) displaced in a perpendicular direction (thicknesswise direction of the semiconductor chip 2) to the surface of the board in a mounted state on the package board 1 with respect to the input optical waveguide 10. In particular, the input optical waveguide 10 and the output optical waveguide 11 individually have a multi-layer structure and have parallel waveguide portions 10A and 11A provided in parallel to each other in a spaced relationship in a heightwise direction of the device, respectively.

On the other hand, the input optical waveguide 10 includes an inclination waveguide portion 10B (for example, a curved waveguide) which is provided in the proximity of the device end face 6B on the semiconductor chip 2 side and which is inclined to the upper side in a vertical direction. Similarly, the output optical waveguide 11 includes an inclination waveguide portion 11B (for example, a curved waveguide) which is provided in the proximity of the device end face 6B on the semiconductor chip 2 side and which is inclined to the lower side in a vertical direction. Then, an end portion of the inclination waveguide portion 10B of the input optical waveguide 10 and an end portion of the inclination waveguide portion 11B of the output optical waveguide 11 cross with and are connected to each other on the device end face 6B on the semiconductor chip 2 side. Since the connecting portion (waveguide end face) 14 between the inclination waveguide portions 10B and 11B is exposed to the outside on the device end face 6B, the exposed portion functions as a light reflection surface.

It is to be noted that, in order to increase the reflectivity of the light reflection surface 14 on the device end face 6B, it is preferable to form, for example, a metal film, a dielectric multilayer film or the like on the light reflection surface 14, for example, by a vapor deposition method or a sputtering method.

Consequently, light propagated through the parallel waveguide portion 10A of the input optical waveguide 10 is guided to the inclination waveguide portion 10B in the proximity of the device end face 6B on the semiconductor chip 2 side and is inputted obliquely from the upper side in a vertical direction to the device end face 6B. Then, the light is reflected on the device end face 6B obliquely to the lower side in a vertical direction so as to be guided to the inclination waveguide portion 11B of the output optical waveguide 11, and then the light is propagated along the parallel waveguide portion 11A of the output optical waveguide 11 in a direction opposite to the propagation direction of light propagated in the input optical waveguide 10.

In this manner, in the present embodiment, shift of light (changeover of an optical path) between multilayer optical waveguides is implemented by the light reflection structure (optical path changeover structure) 12 for reflecting light on the device end face 6B obliquely in a vertical direction. Further, by configuring the optical path changeover structure 12 such that the advancing direction of light (propagation direction of light) propagated through the input optical waveguide 10 is changed over so that the advancing direction of light propagated through the output optical waveguide 11 becomes opposite to the advancing direction of light propagated through the input optical waveguide 10, the plural transmission optical waveguide devices 6 can be integrated in a high density in the proximity of the semiconductor chip 2 on the package board 1 on which the semiconductor chip 2 such as an LSI is mounted.

Therefore, in the present embodiment, the optical path changeover structure (light advancing direction conversion structure) 12 includes the light reflection surface on the device end face, the inclination waveguide portion 10B of the input optical waveguide 10, and the inclination waveguide portion 11B of the output optical waveguide 11 connected to the inclination waveguide portion 10B of the input optical waveguide 10 through the light reflection surface 14, and is configured such that light guided through the inclination waveguide portion 10B of the input optical waveguide 10 is reflected on the light reflection surface 14 so as to be guided to the inclination optical waveguide portion 11B of the output optical waveguide 11.

Further, the waveguide type optical modulator (optical modulation means) 13 for modulating the intensity of light propagated through the waveguide is provided at part of the output optical waveguide 11. By forming the optical modulator 13 at part of the transmission optical waveguide device 6 in this manner, the optical modulator 13 can be integrated with the package board 1 on which the semiconductor chip 2 such as an LSI is mounted.

In the present embodiment, the optical modulator 13 is configured as an optical modulator utilizing variation of the refractive index by an electro-optic effect. Therefore, at least the optical modulator 13 formed at part of the output optical waveguide 11 is formed from a material capable of producing an electro-optic effect.

For example, as a material capable of producing an electro-optic effect, an organic-based material capable of producing an electro-optic effect or an inorganic-based material capable of producing an electro-optic effect can be used.

Here, as an organic-based material capable of an electro-optic effect, for example, a material obtained by mixing an organic pigment capable of developing an electro-optic effect with a polymer material can be used. In this instance, the refractive index can be varied by adjustment of the composition of the polymer material which is used as a base. Therefore, materials for the core and the cladding which configure the optical waveguide can be obtained by adjustment of the composition of the polymer material. It is to be noted that an optical waveguide formed from an organic-based material capable of producing an electro-optic effect can be formed by spin coating a liquid organic-based material on a substrate and using a photolithography technique or the like.

On the other hand, as an inorganic type material capable of producing an electro-optic effect, for example, lithiumniobate, lead lanthanum zirconate titanate (PLZT), lead zirconate titanate (PZT) or the like which are crystal materials having an electro-optic effect can be used. However, since PLZT or PZT allows selection of a crystal axis thereof such that the propagation loss does not depend upon the polarization state of light, it is preferable to use them. In this instance, by changing the concentration of lanthanum La, the refractive index can be changed (if the La concentration increases, then the refractive index decreases). Therefore, by adjusting the La concentration, materials for the core and the cladding which form the optical waveguide can be obtained. It is to be noted that an optical waveguide formed from an inorganic-based material capable of producing an electro-optic effect can be formed using a crystal deposition method such as, for example, a sol-gel method or an MOCVD method. However, an etching process is required for forming of the core.

In particular, the optical modulator 13 may be configured as described below from a material having an electro-optic effect that, if a voltage is applied, then the refractive index varies.

For example, as shown in FIG. 3(B), part of the output optical waveguide 11 is branched such that a Mach-Zehnder type optical waveguide 15 having two optical waveguide arms (branch waveguide portions) 11C and 11D is provided, and modulation electrodes (signal electrodes, driving electrodes) 16A and 16B and a ground electrode 16C are provided in such a manner as to sandwich the optical waveguide arms 11C and 11D therebetween. Then, the optical modulator 13 may be configured as a Mach-Zehnder type optical modulator wherein a voltage (signal voltage, driving voltage) is applied to the modulation electrodes 16A and 16B to apply an electric field to the optical waveguide arms 11C and 11D so that the phase of light propagated through the arms 11C and 11D is varied to modulate the intensity of the light. It is to be noted that, in FIG. 3(B), reference characters 17A, 17B and 17C denote modulation lead wirings connected to the modulation electrodes 16A and 16B and a ground lead wiring connected to the ground electrode 16C, respectively. Further, reference characters 18A, 18B and 18C denote modulation electrode pads formed at end portions of the modulation lead wirings 17A and 17B and a ground electrode pad formed at an end portion of the ground lead wiring 17C, respectively.

Figure 4:
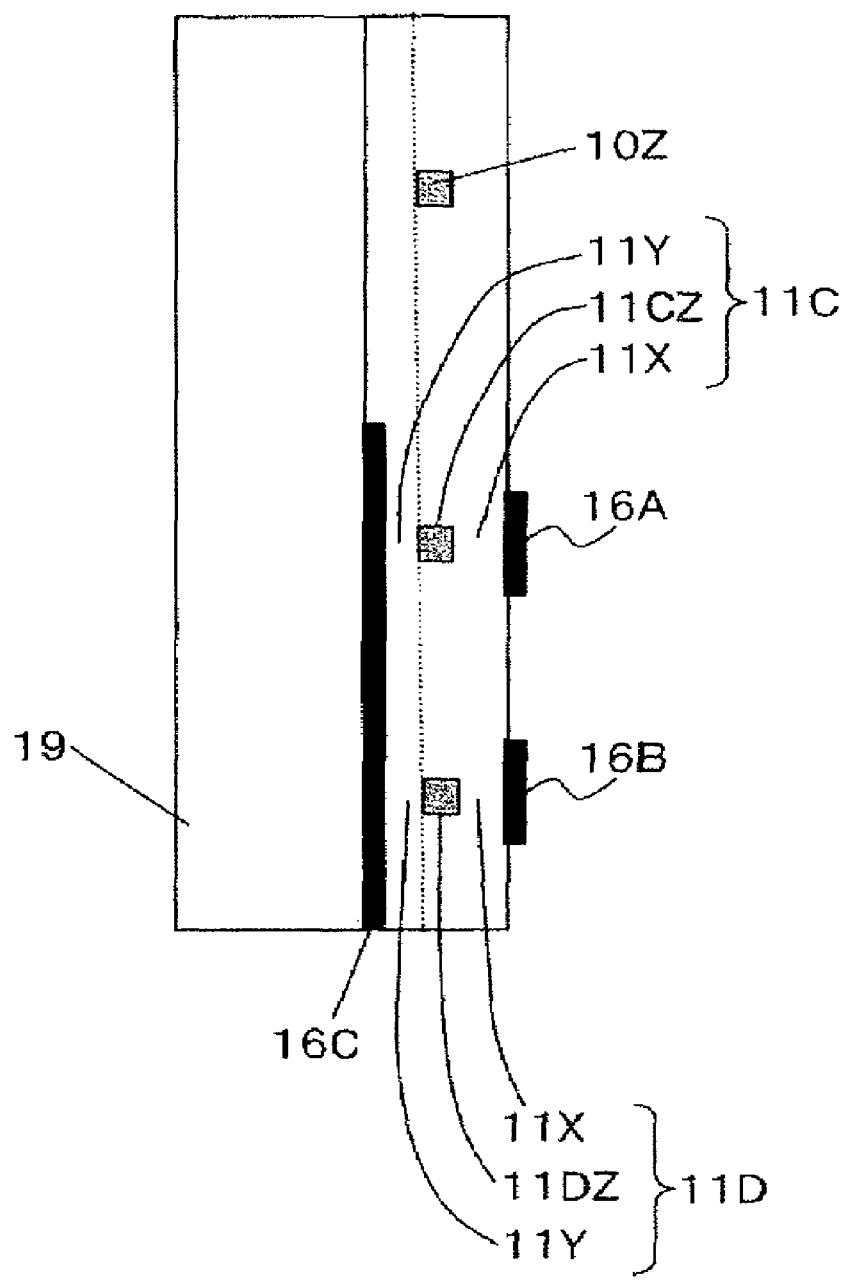
FIG. 4 is a schematic sectional view showing a configuration of the optical waveguide device which composes the semiconductor chip module according to the first embodiment, and is a sectional view taken along line X-X of FIG. 3(B).

Here, as shown in FIG. 4, the optical waveguide arm 11C is configured by stacking a lower cladding layer 11Y, an optical waveguide core layer (core layer) 11CZ and an upper cladding layer 11X in order on an optical waveguide substrate 19. Further, the optical waveguide arm 11D is configured by stacking the lower cladding layer 11Y, an optical waveguide core layer (core layer) 11DZ and the upper cladding layer 11X in order on the optical waveguide substrate 19. Further, the input optical waveguide 10 is configured by stacking the upper cladding layer 11X, an optical waveguide core (core layer) 10Z and the lower cladding layer 11Y in order on the optical waveguide substrate 19.

Then, the modulation electrode 16A is provided on the upper side of the upper cladding layer 11X above the optical waveguide core 11CZ which forms the optical waveguide arm 11C. Further, the modulation electrode 16B is provided on the upper side of the upper cladding layer 11X above the optical waveguide core (core layer) 11DZ which forms the optical waveguide arm 11D. Furthermore, the ground electrode 16C as a common electrode is provided on the lower side of the lower cladding layer 11Y below the optical waveguide cores 11CZ and 11DZ which form the optical waveguide arms 11C and 11D, respectively.

It is to be noted here that, while the modulation electrodes 16A and 16B and the ground electrode 16C are provided on both of the two optical waveguide arms 11C and 11D, the modulation electrodes and the ground electrode may be provided on one of the optical waveguide arms.

In the Mach-Zehnder type optical modulator 13 configured in such a manner as described above, an electric field is applied to one or both of the optical waveguide arms (here, both of optical waveguide arms 11C and 11D) to vary the refractive index by an electro-optic effect thereby to shift the phases of lights propagated through the optical waveguide arms 11C and 11D so that the lights interfere with each other at a portion at which the two optical waveguide arms 11C and 11D are coupled to each other thereby to change over the amplitude of the light to the maximum or the minimum to produce an optical signal.

It is to be noted that the effective optical path lengths of the two branched optical waveguide arms may become different from each other depending upon a small difference in refractive index or in length thereof arising from a forming process of the optical waveguide. In this instance, a phase difference appears between the lights propagated through the optical waveguide arms 11C and 11D in a state wherein no voltage is applied to the electrodes (modulation signal off state), and the optical output after interference may not become the maximum or the minimum (refer to FIG. 5). In this instance, a voltage (bias voltage) for fine adjustment may be applied to one of the optical waveguide arms so as to perform differential operation so that no phase difference may appear.

Figure 5:
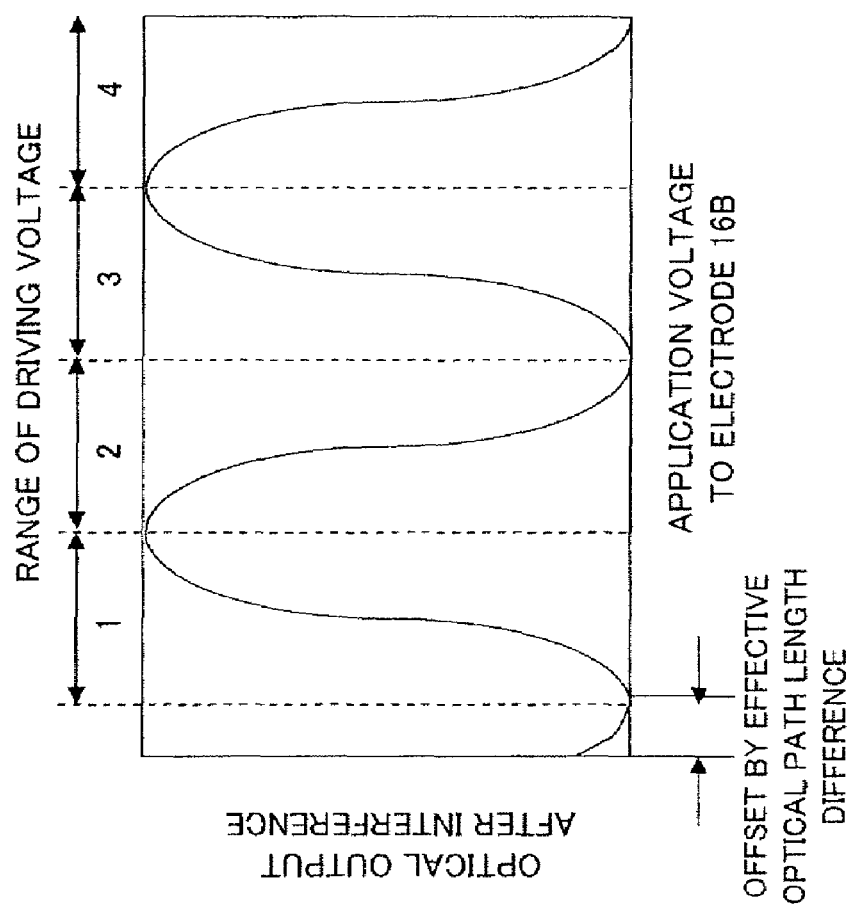
FIG. 5 is a view illustrating a driving voltage for an optical modulator provided on the semiconductor chip module according to the first embodiment.

For example, where an offset appears with the minimum value of the optical output after interference by an effective optical path length difference as shown in FIG. 5, a voltage (bias voltage) for fine adjustment may be applied to one of the electrodes [here, fine adjustment electrode (bias electrode) 16A] so that no offset may appear.

In the present embodiment, the modulation electrodes 16A and 16B and the ground electrode 16C are provided on both of the two optical waveguide arms 11C and 11D such that a voltage (bias voltage) for fine adjustment is steadily applied to the modulation electrode 16A provided on the optical waveguide arm 11C, and lights propagated through the optical waveguide arms 11C and 11D interfere with each other in a state wherein no voltage is applied to the modulation electrode 16B provided on the other optical waveguide arm 11D (modulation signal off state) so that the optical output becomes substantially zero. It is to be noted that, since a voltage (bias voltage) for fine adjustment is applied to the modulation electrode 16A provided on the optical waveguide arm 11C, the electrode 16A is sometimes referred to as fine adjustment electrode (bias electrode). Further, a bias electrode may be provided separately from the modulation electrodes 16A and 16B.

It is to be noted that FIG. 5 shows a relationship between the applied voltage to the modulation electrode 16B and the intensity of the optical output after interference. As shown in FIG. 5, where the intensity of light is modulated, while a plurality of ranges denoted by reference numerals 1, 2, 3, 4 and in FIG. 5 can be selected as a range of a voltage (driving voltage) to be applied to the modulation voltage 16B, it is preferable to select a region of a voltage as low as possible with which the intensity of light can be modulated at a high speed.

It is to be noted here that, while the optical modulator 13 is provided at the output optical waveguide 11, the location of the optical modulator 13 is not limited to this, but the optical modulator 13 may be provided at the input optical waveguide 10.

The transmission optical waveguide device 6 having the optical modulator 13 configured in such a manner as described above is fabricated in the following manner as shown in FIGS. 6(A) to 6(F). It is to be noted that FIGS. 6(A) to 6(F) are sectional views taken along line X-X of FIG. 3(B).

Figure 6A:
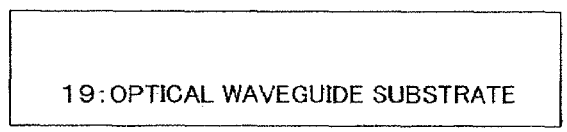
FIGS. 6(A) to 6(F) are schematic sectional views illustrating a fabrication method for the optical waveguide device which composes the semiconductor chip module according to the first embodiment.

First, as shown in FIG. 6(A), an optical waveguide substrate 19 to be used to form the transmission optical waveguide device 6 is prepared.

Here, it is assumed that the optical waveguide substrate 19 has a thickness corresponding to a value obtained by subtracting the thickness (for example, 5 μm) of an adhesive layer formed when a plurality of transmission optical waveguide devices 6 are adhered to form an optical wiring transmission array from the pitch (for example, 250 μm) of an optical fiber array (for example, an optical fiber sheet) used for carrying out optical wiring.

Figure 6B:
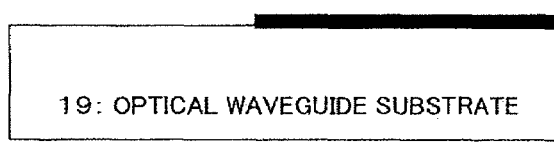

Then, as shown in FIG. 6(B), a ground electrode 16C (including a lead wiring 17C extending to a substrate side face) is formed in a region of the optical waveguide substrate 19 in which the optical modulator 13 is to be formed by combining, for example, a sputtering method and etching. Here, the ground electrode 16C may be configured as an electrode having a multilayer structure formed, for example, from Cr (chrome), Ni (nickel), Au (gold) or the like.

Figure 6C:
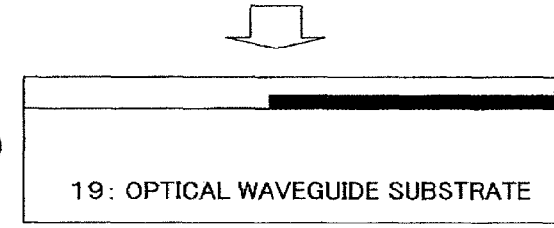

Then, as shown in FIG. 6(C), a lower cladding layer 11Y is formed using an optical waveguide material (here, EO polymer) having an electro-optic effect (EO effect) for example, by a spin coating method.

Then, after a core layer is formed using an optical waveguide material which has an electro-optic effect and whose refractive index is set higher than that of the lower cladding layer 11Y, patterning is performed using, for example, a photolithography technique to form patterns of the optical waveguide cores which form the input optical waveguide 10 and the output optical waveguide 11.

Figure 6D:
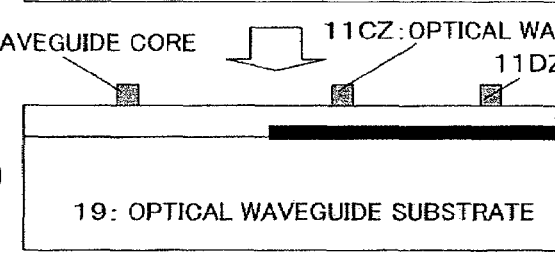

In the present embodiment, in order to configure the optical modulator 13 to be provided at the output optical waveguide 11 as a Mach-Zehnder type optical modulator as shown in FIG. 6(D), optical waveguide cores 11CZ and 11DZ which form the two optical waveguide arms 11C and 11D are formed. It is to be noted that, in FIG. 6(D), reference character 10Z denotes an optical waveguide core which forms the input optical waveguide 10.

Figure 6E:
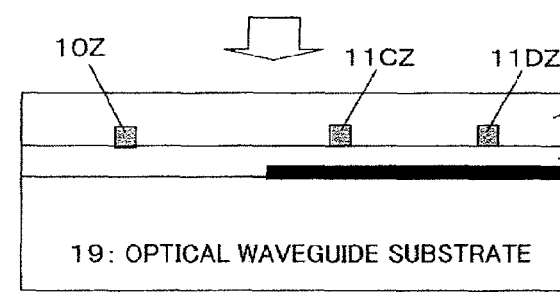

Then, as shown in FIG. 6(E), an upper cladding layer 11X is formed using a material same as that for the lower cladding layer 11Y, for example, by a spin coating method such that the patterned optical waveguide cores 10Z, 11CZ and 11DZ are buried in the upper cladding layer 11X.

Figure 6F:
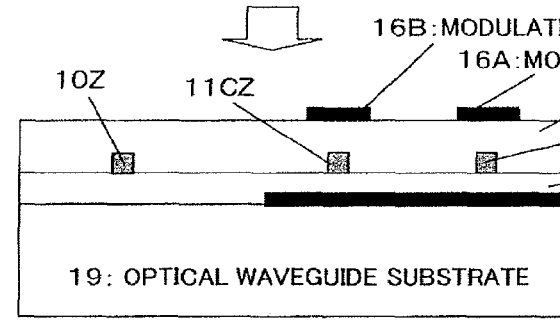

Thereafter, as shown in FIG. 6(F), modulation electrodes 16A and 16B are formed on the surface of the upper cladding layer 11X above the optical waveguide cores 11CZ and 11DZ which form the two optical waveguide arms 11C and 11D of the Mach-Zehnder type optical modulator 13. The transmission optical waveguide device 6 is fabricated in this manner.

Incidentally, in the present embodiment, a plurality of transmission optical waveguide devices 6 configured in such a manner as described above are prepared and are arranged in a juxtaposed relationship in a parallel direction on the surface of the package board 1. In particular, in the present embodiment, a transmission optical waveguide device 6 configured in such a manner as described above is determined as a unit structure, and a plurality of transmission optical waveguide devices 6 are integrated to form a multi-channel optical wiring transmission array (optical signal transmission section) 60 as shown in FIG. 3(A) and are mounted on the package board 1 together with the semiconductor chip 2 as shown in FIG. 9.

In particular, a plurality of plate-like transmission optical waveguide devices 6 each having a predetermined thickness (for example, 0.25 mm; thickness corresponding to the pitch of the optical fiber array) are produced using a general optical waveguide technique in such a manner as described above [refer to FIGS. 6(A) to 6(F)]. Then, the front face of each of the transmission optical waveguide devices 6 and the back face of another one of the transmission optical waveguide device 6 are adhered to each other while end faces of them are adjusted to each other in a state wherein a plurality of (here, two) transmission optical waveguide devices 6 are erected uprightly (in particular, one side face of the transmission optical waveguide devices 6 is positioned on the lower side) to produce an optical wiring transmission array 60 [refer to FIG. 3(A)]. Then, the optical wiring transmission array 60 is mounted on the package board 1 in such a manner that, as shown in FIGS. 3(A), 3(B) and 9, the bottom face of the optical wiring transmission array 60 (side face of the transmission optical waveguide devices 6) and the surface of the package board 1 are opposed to each other such that the input optical waveguides 10 and the output optical waveguides 11 are disposed at positions displaced in a direction perpendicular to the board surface (in the thicknesswise direction of the semiconductor chip 2). It is to be noted that the adhesive layer is omitted in FIG. 3(A).

In this instance, the pitch between the input optical waveguides 10 provided on the transmission optical waveguide devices 6 is equal to the thickness (for example, 0.25 mm) of the transmission optical waveguide devices 6.

Figure 9:
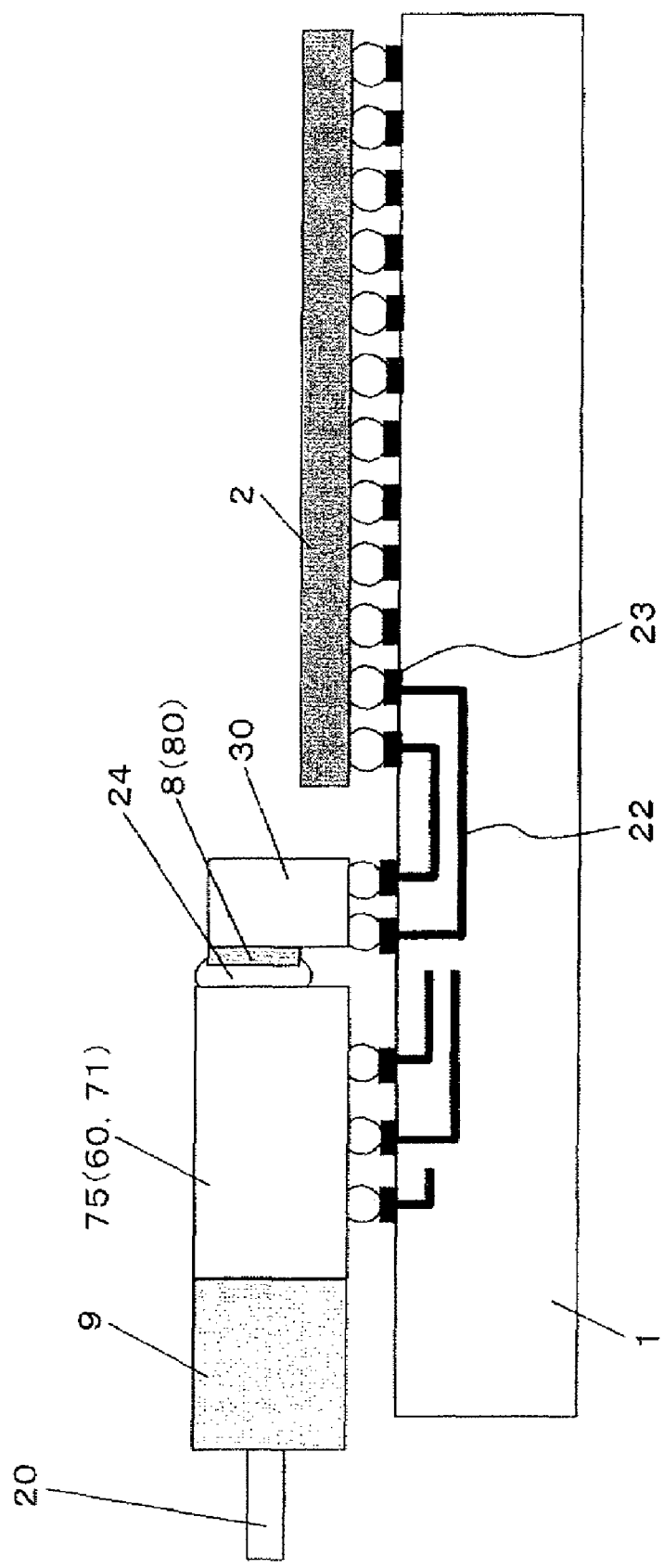
FIG. 9 is a schematic sectional view showing a mounted state of the semiconductor chip module according to the first embodiment.

In the present embodiment, since an input optical waveguide 10 and an output optical waveguide 11 are formed on the package board 1 in a juxtaposed relationship at different positions in the thicknesswise direction of the optical wiring transmission array 60 (in the direction perpendicular to the board surface), the optical wiring transmission array 60 can be connected to an optical fiber array 20 (for example, two optical fiber sheets) integrated by laminating optical fibers on two stages, for example, through the optical fiber connector 9 (refer to FIG. 9). Here, as a connection method, a butt joint method using general optical adhesive can be used.

Then, as shown in FIG. 1, the other ends of the optical fibers which form the optical fiber array 20 are connected to one external light source (common light source) 5 such that light from the common light source 5 is supplied to the transmission optical waveguide devices 6. Then, as shown in FIGS. 3(A) and 3(B), the light is modulated by the optical modulators 13 individually provided at the transmission optical waveguide devices 6. In particular, the light from the one external light source 5 is branched into a plurality of lights and the branched lights are inputted to the transmission optical waveguide devices 6 through a plurality of optical fibers so that the inputted lights are modulated by the optical modulators 13 provided on the transmission optical waveguide devices 6.

It is to be noted here that, while one common light source is used as the external light source 5, the light source is not limited to this. For example, a plurality of common light sources may be provided such that, even if one of the common light sources fails, another one of the common light sources can be utilized as a backup light source.

Incidentally, in the present embodiment, the modulation electrodes 16A and 16B of each optical modulator 13 are electrically connected to terminals (for example, LSI terminals) of the semiconductor chip 2 such that the optical modulator 13 is directly driven by a signal voltage (low voltage signal; output signal) of the semiconductor chip 2 such as an LSI (for example, a CMOS).

Here, as shown in FIG. 3(B), the modulation lead wirings (electric wirings) 17A and 17B are formed on the surface of each transmission optical waveguide terminal 6 so as to extend from the modulation electrodes 16A and 16B provided on the two optical waveguide arms 11C and 11D which form the optical modulator 13 to a side face of the transmission optical waveguide device 6. A side face of the transmission optical waveguide device 6 becomes the bottom face in a state wherein the transmission optical waveguide device 6 is mounted on the package board 1). Further, the ground lead wiring (electric wiring) 17C is formed in the inside of the transmission optical waveguide device 6 so as to extend from the common ground electrode 16C provided on the two optical waveguide arms 11C and 11D to the side face of the transmission optical waveguide device 6. Further, the modulation electrode pads 18A and 18B and the ground electrode pad 18C are provided as connection points at end portions of the lead wirings 17A, 17B and 17C extending to the side face of the transmission optical waveguide device 6, respectively.

Figure 7:
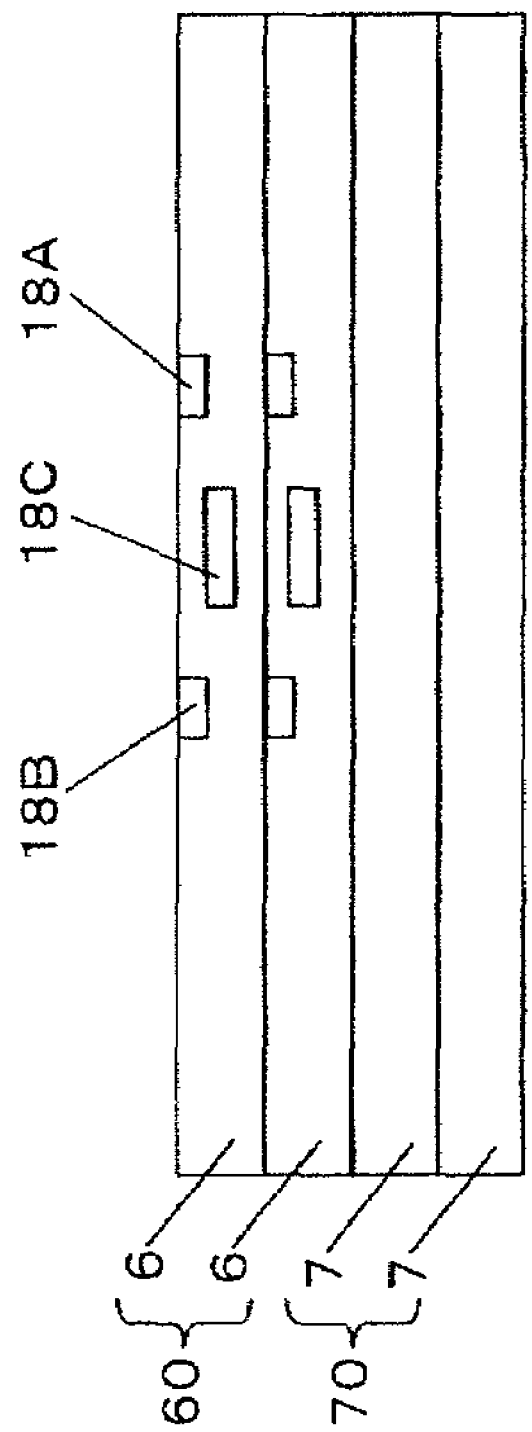
FIG. 7 is a schematic sectional view showing a configuration of the optical waveguide device which composes the semiconductor chip module according to the first embodiment.

Here, where a plurality of (here, two) transmission optical waveguide devices 6 are integrated to form the optical wiring transmission array 60, as shown in FIG. 7, the bottom face of the optical wiring transmission array 60 serves as an electrode pad face on which the electrode pads formed on the side faces of the transmission optical waveguide devices 6 are arrayed.

On the other hand, as shown in FIG. 9, electric wirings 22 (here, muitilayer wirings having a three-dimensional wiring structure) extending from the region in which the semiconductor chip 2 is mounted to another region in which a wiring block 30 on which the optical wiring transmission array 60 and a photo-detector (PD) 8 are mounted are formed on the package board 1 on which the semiconductor chip (for example, an LSI) 2 is mounted. As the package board 1, for example, a general multilayer printed board may be used. It is to be noted that the electric wirings 22 formed in the inside of the package board 1 extend to the board surface in the individual mounting regions, and wiring pads 23 are formed at the end portions of the electric wirings 22.

Then, in the semiconductor chip mounting region (for example, in the LSI mounting region), terminals (for example, LSI terminals) of the semiconductor chip 2 are connected to the wiring pads 23 formed on the board surface to mount the semiconductor chip 2 on the package board 1. For example, the LSI 2 is mounted by ball grid array (BGA) mounting on the package board 1.

On the other hand, similarly to the semiconductor chip 2, in the optical wiring transmission array mounting region, the electrode pads 18A to 18C individually formed on the side faces of the transmission optical waveguide devices 6 (on the bottom face of the optical wiring transmission array 60) and the wiring pads 23 formed on the board surface are connected, for example, by soldering to mount the optical wiring transmission array 60 on the package board 1. It is to be noted that the connection between the wiring pads 23 and the electrode pads 18A to 18C may be carried out using, for example, conductive paste.

Consequently, the modulation electrodes 16A and 16B of each of the optical modulators 13 and terminals of the semiconductor chip 2 (for example, LSI terminals) are electrically connected to each other by electric wirings such that an electric signal (LSI signal) from the semiconductor chip 2 is supplied to each of the optical modulators 13.

It is to be noted that, in order to make the length of the electric wirings 22 as short as possible, it is preferable to provide the optical modulators 13 in the proximity of the device end face of the transmission optical waveguide devices 6 on the semiconductor chip 2 side. A wiring distance, for example, within several millimeters can be implemented.

Incidentally, each reception optical waveguide device 7 is provided in the proximity of a side face of the semiconductor chip 2 on the package board 1 and is used to receive an optical signal from a different device. Here, the reception optical waveguide device 7 is configured, for example, as a polymer optical waveguide device.

In the present embodiment, the reception optical waveguide device 7 includes an input optical waveguide (reception input optical waveguide) for guiding an optical signal from a different device to the device end face on the semiconductor chip 2 side and an optical waveguide for processing a reflection light which is connected to the input optical waveguide through the device end face and has an optical absorption structure (for example, a process for absorbing light such as application of a light absorbing material may be performed for a different terminal end or the like) for absorbing light reflected on the device end face without being received by the photoelectric conversion device.

Here, the reception input optical waveguide is formed similarly to the input optical waveguide 10 of the transmission optical waveguide device 6 described above. Further, the optical waveguide for processing a reflection light is formed similarly to the output optical waveguide 11 of the transmission optical waveguide device 6 described above. It is to be noted that a fabrication method for the reception optical waveguide device 7 is similar to the fabrication method for the transmission optical waveguide device 6 described above.

However, it is a matter of course that an optical modulator need not be provided on the reception optical waveguide device 7. Further, a reflection film is not formed on a device end face (waveguide end face) on which an end portion of the inclined waveguide portion of the reception input optical waveguide and an end portion of the inclined waveguide portion of the optical waveguide for processing a reflection light intersect with each other, but to this waveguide end face, a light reception face of the photoelectric conversion device 8 hereinafter described is adhered by optical adhesive 24 as shown in FIG. 9. By filling a transparent medium (optical adhesive) between the photoelectric conversion device 8 and the waveguide end face in this manner, reflection of light propagated through the reception input optical waveguide can be suppressed and the light can be effectively guided to the light reception face of the photoelectric conversion device 8.

Here, the reason why the reception input optical waveguide is configured so as to have an inclined waveguide portion and besides the optical waveguide for processing a reflection light is provided is that it is intended to suppress the influence of returning light or stray light as far as possible.

In the present embodiment, a plurality of (here, two) reception optical waveguide devices 7 configured in such a manner as described above are prepared and are arranged in a juxtaposed relationship in a parallel direction on the surface of the package board 1. In particular, in the present embodiment, each reception optical waveguide device 7 configured in such a manner as described above is determined as a unit structure and a plurality of reception optical waveguide devices 7 are integrated to form a multi-channel optical wiring reception array (optical signal reception section) 70 as shown in FIG. 3(A) and are mounted on the package board 1 together with the semiconductor chip 2 as shown in FIG. 9. It is to be noted that the optical wiring reception array 70 is formed and mounted similarly to the optical wiring transmission array 60 described above.

In particular, the optical wiring reception array 70 and the optical wiring transmission array 60 described are integrated with each other to form an optical wiring transmission and reception array (optical signal transmission and reception section) 75, and this optical wiring transmission and reception array 75 is mounted on the package board 1 together with the semiconductor chip 2 [refer to FIG. 3(A)].

As a result, a plurality of (here, two) transmission optical waveguide devices 6 and a plurality of (here, two) reception optical waveguide devices 7 are provided in a juxtaposed relationship in a parallel direction on the surface of the package board 1 (refer to FIGS. 2 and 9).

In the present embodiment, similarly as in the case of the optical wiring transmission array 60 described above, the input optical waveguide and the optical waveguide for processing a reflection light are provided in a juxtaposed relationship at positions (different positions) on the package board 1 displaced from each other in the thicknesswise direction of the optical wiring reception array 70 (in a direction perpendicular to the board surface; in the thicknesswise direction of the semiconductor chip 1). Therefore, the optical wiring reception array 70 can be connected to the optical fiber array 20 integrated by laminating optical fibers (for example, optical fiber sheets) on two stages, for example, through the optical fiber connector 9 (refer to FIG. 9). It is to be noted that the other end of each of the optical fibers which form the optical fiber array 20 is connected to a different device.

It is to be noted that, while, in the present embodiment, taking it into consideration that the refractive index of the photoelectric conversion device 8 and the refractive index of the optical adhesive 24 are different from each other and cancellation of reflection on an interface between them is difficult, the optical waveguide for processing a reflection light having an optical absorption structure is provided so that reflection light does not make noise in the entire optical system, the configuration regarding the optical waveguide for processing a reflection light is not limited to this. For example, the reception optical waveguide device 7 may be configured as a device which does not include the optical waveguide for processing a reflection light but includes only the input optical waveguide.

The photoelectric conversion device 8 is a device for converting an optical signal into an electric signal. Here, the photoelectric conversion device 8 is mounted on the package board 1 so as to be connected to the device end face of the reception optical waveguide device 7 on the semiconductor chip 2 side.

Figure 8:
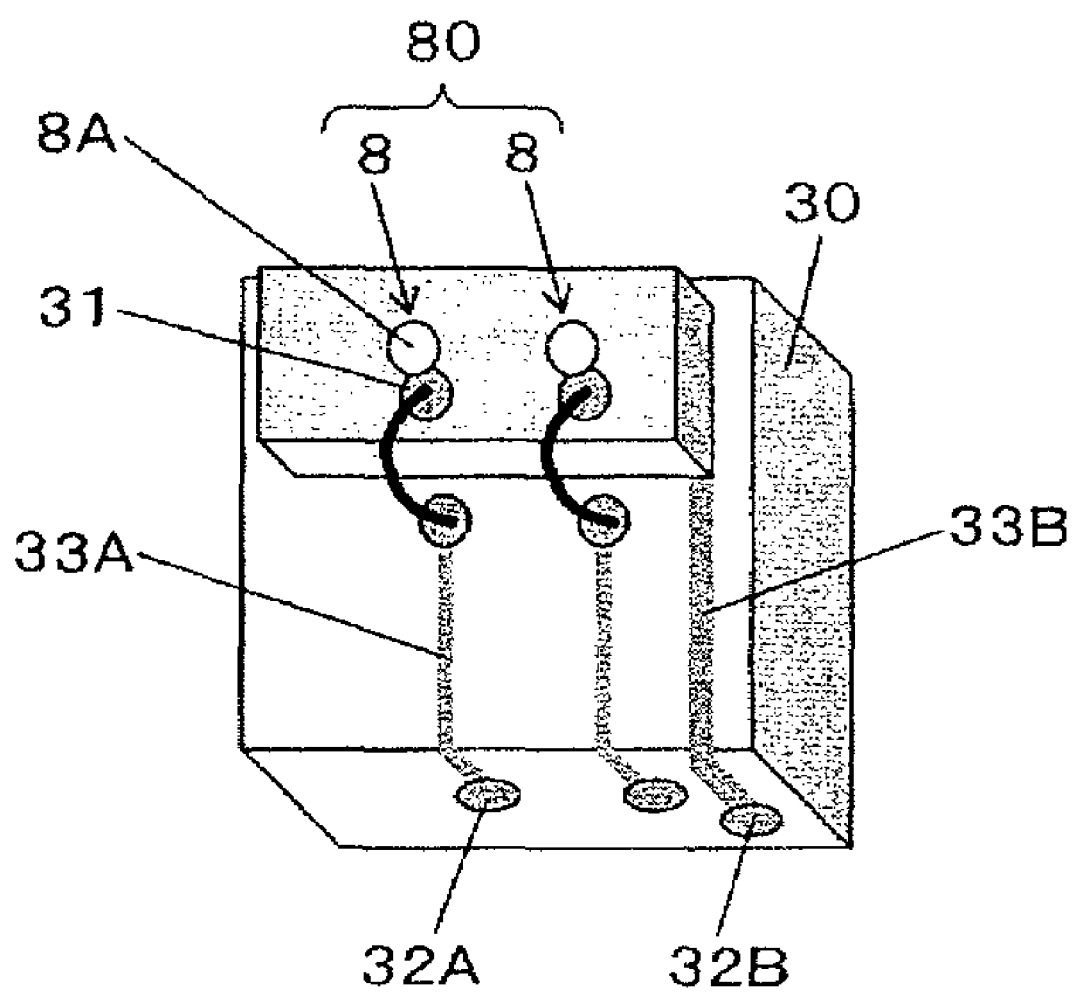
FIG. 8 is a schematic view showing a mounted state of a photodetector which composes the semiconductor chip module according to the first embodiment.

As the photoelectric conversion device 8, a photodetector (photodetector; PD) such as, for example, a photodiode may be used. Here, as shown in FIG. 8, photodetector chip 80 in the form of an array (PD chip; photodetector chip; photoelectric conversion device array, photodetector array) wherein light reception faces 8A of a plurality of (here, two) photodetectors 8 are integrally formed so as to be juxtaposed in an array (for example, of a pitch of 0.25 mm) is used. The array photodetector chip 80 is configured such that the photoelectric conversion devices 8 are provided one by one on the plural reception optical waveguide devices 7.

Further, each photoelectric conversion device 8 is electrically connected to a terminal (for example, an LSI terminal) of the semiconductor chip 2 and can transmit an electric signal obtained by converting a received optical signal to the semiconductor chip (for example, an LSI).

Here, as shown in FIG. 8, the array PD chip 80 is connected to the wiring block 30 so that the array PD chip 80 is mounted on the wiring block 30. In this instance, each of the signal electrodes 31 formed in the proximity of the light reception faces 8A of the PDs 8 which form the PD chip 80 is connected to a signal electrode lead wiring (electric wiring) 33A extending to an electrode pad (signal electrode pad) 32A on the bottom face of the wiring block 30, for example, by wire bonding. On the other hand, a substrate of the PD chip 80 is connected to a ground electrode lead wiring (electric wiring) 33B extending to an electrode pad (ground electrode pad) 32B on the bottom face of the wiring block 30. Consequently, the PDs 8 are grounded through the common lead wiring 33B. It is to be noted that the bottom face of the wiring block 30 serves as an electrode pad face on which the electrode pads 32A and 32B are disposed collectively.

Then, similarly as in the semiconductor chip (for example, an LSI) 2, the wiring pads 23 formed on the board surface of the package board 1 and the electrode pads 32A and 32B formed on the bottom face of the wiring block 30 are connected to each other in the PD mounting region on the package board 1, for example, by soldering to mount the wiring block 30, on which the array PD chip 80 is mounted, on the package board 1 (refer to FIG. 9). It is to be noted that the connection between the wiring pads 23 and the electrode pads 32A and 32B may be carried out, for example, using conductive paste.

Consequently, the terminals (electrodes) of the photoelectric conversion devices (here, PDs) 8 and the terminals (for example, LSI terminals) of the semiconductor chip 2 are electrically connected to each other through the electric wirings such that an electric signal received and converted by each photoelectric conversion device 8 is transmitted to the semiconductor chip (for example, an LSI) 2.

In the present embodiment, as shown in FIG. 9, the photoelectric conversion devices 8 are adhered to the device end face of the reception optical waveguide device 7 on the semiconductor chip 2 side, for example, by the optical adhesive 24 such that the light reception face of the devices 8 contacts with the waveguide end face exposed on the device end face of the reception optical waveguide device 7 on the semiconductor chip 2 side. In particular, while, in the embodiment, the reception optical waveguide devices 7 are provided in the proximity of a side face of the semiconductor chip 2, the photoelectric conversion devices 8 are disposed between the side face of the semiconductor chip 2 and the device end face of the reception optical waveguide device 7 such that the light reception faces (optical detection faces) 8A of the photoelectric conversion device 8 contact with the waveguide end faces of the reception optical waveguide devices 7. It is to be noted that a structure wherein the photoelectric conversion devices 8 (photoelectric conversion device array 80) are adhered to the reception optical waveguide devices 7 (optical wiring reception array 70) is referred to as optical waveguide composite structure.

It is to be noted here that, while the light reception faces 8A of the photoelectric conversion devices 8 contact with the waveguide end faces of the reception optical waveguide devices 7, the arrangement of the photoelectric conversion devices 8 is not limited to this. For example, if light emitted from the waveguide end faces of the reception optical waveguide devices 7 can be received, then the light reception faces 8A of the photoelectric conversion devices 8 may be spaced away from the waveguide end faces of the reception optical waveguide devices 7. Further, for example, a lens may be used so that light outputted from the waveguide end faces of the reception optical waveguide devices 7 is optically coupled to the light reception faces 8A of the photoelectric conversion devices 8.

In this manner, in the present embodiment, as shown in FIG. 9, the semiconductor chip module is configured as a module wherein the semiconductor chip 2, optical wiring transmission array 60, optical wiring reception array 70 and photoelectric conversion devices 8 (photoelectric conversion device chip 80) are integrally mounted on the package board 1.

Here, when the parts are mounted on the package board 1, a general surface mounting technique for an electronic device can be used. In this instance, since the technique does not require optical alignment with high accuracy, it is suitable for cost reduction.

Particularly, in the present embodiment, the semiconductor chip module is configured such that an input optical waveguide 10 and an output optical waveguide 11 are provided in parallel at the positions (different positions) displaced from each other in the thicknesswise direction of the semiconductor chip 2 (in a perpendicular direction to the board surface) such that the advancing direction of light is converted utilizing the reflection on the end face of each transmission optical waveguide device 6 disposed in the proximity of the semiconductor chip 2 so that the advancing direction of light (propagation direction of light) in the input optical waveguide 10 and the advancing direction of light in the output optical waveguide 11 become opposite to each other. Therefore, light from the external light source 5 can be guided once to a position in the proximity of the semiconductor chip 2 and modulated in the proximity of the semiconductor chip 2, whereafter the modulated optical signal is transmitted to a different device. Consequently, an optical system necessary for an optical interconnection can be mounted in a high density around the semiconductor chip 2.

Since the semiconductor chip module according to the present embodiment is configured in such a manner as described above, light supplied from the common light source 5 provided externally is divided into a plurality of lights and the divided lights are guided to the optical modulators 13 of the optical wiring transmission array 60 disposed in a high density in the proximity of the semiconductor chip 2 (for example, an LSI). Then, the guided lights are directly modulated with the driving signal (low voltage signal) of the semiconductor chip 2 to produce optical signals (transmission signals) which are to be transmitted to different devices.

On the other hand, an optical signal transmitted from a different device is guided to a photoelectric conversion device 8 through the optical wiring reception array 70 disposed in a high density in the proximity of the semiconductor chip 2, and photoelectric current generated by the photoelectric conversion device 8 is sent to the semiconductor chip 2 and is amplified by an amplification circuit built in the semiconductor chip 2 so as to be received as an electric signal (reception signal).

Accordingly, with the semiconductor chip module according to the present embodiment, there is an advantage that an optical interconnection whose size is decreased so that a great number of optical wiring structures can be mounted in a high density in the proximity of the semiconductor chip 2 (for example, an LSI) can be implemented while the cost is suppressed low.

Particularly, in the present embodiment, since all of the optical wiring structures can be disposed in a high density in the proximity of the semiconductor chip 2 (for example, an LSI) and, for example, a driver IC for high-speed optical modulation and so forth need not be provided, a small optical interconnection can be implemented at a low cost. Further, since the common light source 5 is used in the optical interconnection, the cost for the light source can be suppressed low.

Further, similarly as in the conventional technique, a region just under the semiconductor chip 2 can be utilized for connection between a great number of terminals such as signal terminals, power supply terminals and ground terminals of the semiconductor chip 2 and the package board 1. Therefore, the semiconductor chip 2 (for example, an LSI) which has, for example, a built-in optical device and so forth need not be newly designed, and the semiconductor chip 2 (for example, an LSI) having a conventional design can be used as it is.

Further, in the present embodiment, since modulation of light is directly carried out using a driving signal (for example, an LSI signal) of the semiconductor chip 2 to produce an optical signal, also there is an advantage that an optical interconnection which allows high-speed modulation and exhibits a low latency (low delay) can be implemented.

It is to be noted that, while, in the present embodiment, the semiconductor chip module is configured as a module which includes the reception optical waveguide devices 7 and the photoelectric conversion devices 8, the semiconductor chip module is not limited to this. For example, the semiconductor chip module can be configured as a module which includes the semiconductor chip 2 and the transmission optical waveguide devices 6.

Incidentally, if the semiconductor chip module according to the present embodiment configured in such a manner as described above is used, then an optical interconnection between a plurality of LSI optical modules can be implemented by using the optical fiber array 20 (for example, an optical fiber sheet) to connect the optical wiring transmission array 60 which configures an LSI optical module and the optical wiring reception array 70 which configures a different LSI optical module.

Examples of a configuration of an optical connection in which the semiconductor chip module according to the present embodiment described above is used are described below.

First Example of a Configuration

Figure 10A:
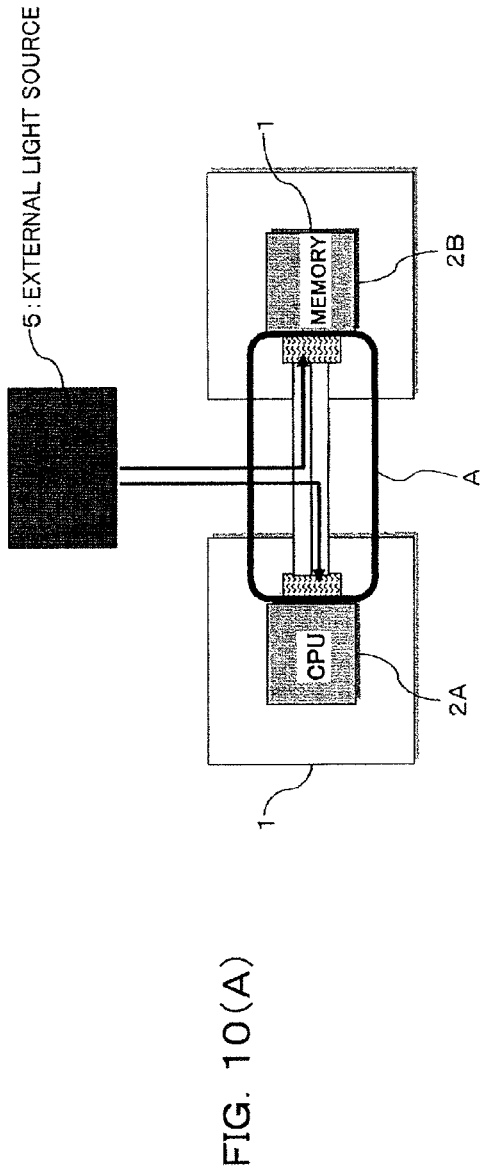
FIG. 10(A) is a view showing a general configuration of an example of a configuration of an optical interconnection between a CPU chip module as the semiconductor chip module according to the first embodiment and a memory chip module.
Figure 10B:
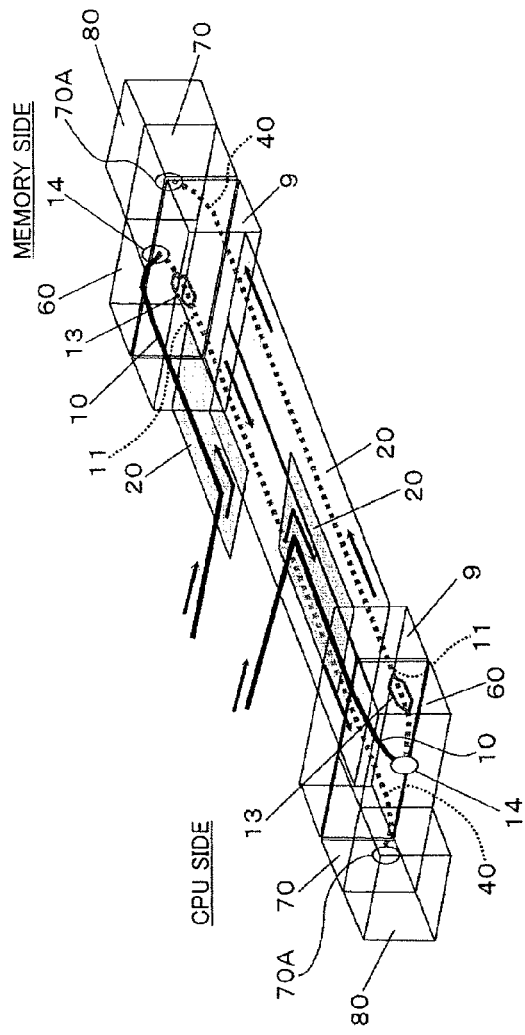
FIG. 10(B) is a schematic view showing details of a region indicated by a reference character A in FIG. 10(A).

As shown in FIGS. 10(A) and 10(B), a first example of a configuration is a configuration example where a CPU 2A and a memory 2B are optically connected to each other. It is to be noted that FIG. 10(B) shows an A portion of FIG. 10(A) in an enlarged scale.

In the present configuration example, as shown in FIGS. 10(A) and 10(B), a CPU module and a memory module are prepared as the semiconductor chip module in the embodiment described above and are connected to each other using an optical fiber array 20 (for example, an optical fiber sheet).

Here, as shown in FIGS. 10(A) and 10(B), the CPU module is configured as a module wherein a CPU 2A, an optical wiring transmission array 60 including an optical modulator 13 and a light reflection surface 14, an optical wiring reception array 70, an optical fiber connector [for example, an MT (Mechanically Transferable) connector] 9, and a PD array 80 connected to a PD connection face 70A of the optical wiring reception array 70 are mounted on a package board 1.

As shown in FIGS. 10(A) and 10(B), the memory module is configured as a module wherein a memory 2B, an optical wiring transmission array 60 including an optical modulator 13, an optical wiring reception array 70, an optical fiber connector 9, and a PD array 80 connected to a PD connection face 70A of the optical wiring reception array 70 are mounted on a package board 1.

It is to be noted that, while, in order to simplify the description, an optical waveguide which configures the optical wiring transmission arrays 60 and another optical waveguide which configures the optical wiring reception arrays 70 are schematically shown one by one in FIGS. 10(A) and 10(B), actually the optical wiring transmission arrays 60 and the optical wiring reception arrays 70 are individually configured as an array wherein a plurality of optical waveguides (as occasion demands, including also optical waveguides for processing a reflection light) are arranged in an array.

Further, connection faces of the optical wiring transmission arrays 60 and the optical wiring reception arrays 70 are individually configured as a face having a standardized interface so that connection to an optical fiber connector (for example, an MT connector) 9 can be established.

Further, a required number of optical fibers for guiding light from the external light source 5 may be prepared (branched) and connected individually to the CPU module and the memory module.

Where the CPU 2A and the memory 2B are optically connected in such a manner as described above, they operate in the following manner.

Light supplied from the external light source 5 through an optical fiber which configures the optical fiber array 20 (for example, an optical fiber sheet) and the optical fiber connector (for example, an MT connector) 9 is guided to the input optical waveguide 10 of the optical wiring transmission array 60 which forms the CPU module, and the light is reflected on the light reflection surface 14 formed on the end face of the optical wiring transmission array 60 and is guided to the output optical waveguide 11 provided at a position displaced in a direction perpendicular to the board surface with respect to the input optical waveguide 10. Then, the optical modulator 13 provided on the output optical waveguide 11 is driven with an electric signal from the CPU 2A to modulate the light propagated through the output optical waveguide 11, and the modulated optical signal is transmitted to the memory module through the optical fiber connector 9 and an optical fiber which configures the optical fiber array 20 (for example, an optical fiber sheet).

Here, since the output optical waveguide 11 of the CPU module is connected to an input optical waveguide (reception input optical waveguide) 40 of the optical wiring reception array 70 which forms the memory module through the optical fiber connector 9 and an optical fiber which forms the optical fiber array 20 (for example, an optical fiber sheet), the optical signal modulated by the optical modulator 13 of the CPU module is guided to the input optical waveguide 40 of the memory module and enters the light reception face of a PD which configures the PD array 80 through the PD connection face 70A on the end face of the optical wiring reception array 70 so that it is converted into an electric signal by the PD and sent to the memory 2B.

On the other hand, light supplied from the external light source 5 through the optical fiber which configures the optical fiber array 20 (for example, an optical fiber sheet) and the optical fiber connector 9 is guided to the input optical waveguide 10 of the optical wiring transmission array 60 which configures the memory module, and the light is reflected on the light reflection surface 14 formed on the end face of the optical wiring transmission array 60 and is guided to the output optical waveguide 11 provided at a position displaced in a direction perpendicular to the board surface with respect to the input optical waveguide 10. Then, the optical modulator 13 provided on the output optical waveguide 11 is driven with an electric signal from the memory 2B to modulate the light propagated through the output optical waveguide 11, and the modulated optical signal is transmitted toward the CPU module through the optical fiber connector 9 and the optical fiber which configures the optical fiber array 20 (for example, an optical fiber sheet).

Here, since the output optical waveguide 11 of the memory module is connected to the input optical waveguide 40 of the optical wiring reception array 70 which forms the CPU module through the optical fiber connector 9 and the optical fiber which forms the optical fiber array 20 (for example, an optical fiber sheet), the optical signal modulated by the optical modulator 13 of the memory module is guided to the input optical waveguide 40 of the CPU module and enters the light reception face of a PD which forms the PD array 80 through the PD connection face 70A on the end face of the optical wiring reception array 70 so that it is converted into an electric signal by the PD and sent to the CPU.

Second Example of a Configuration

Figure 11:
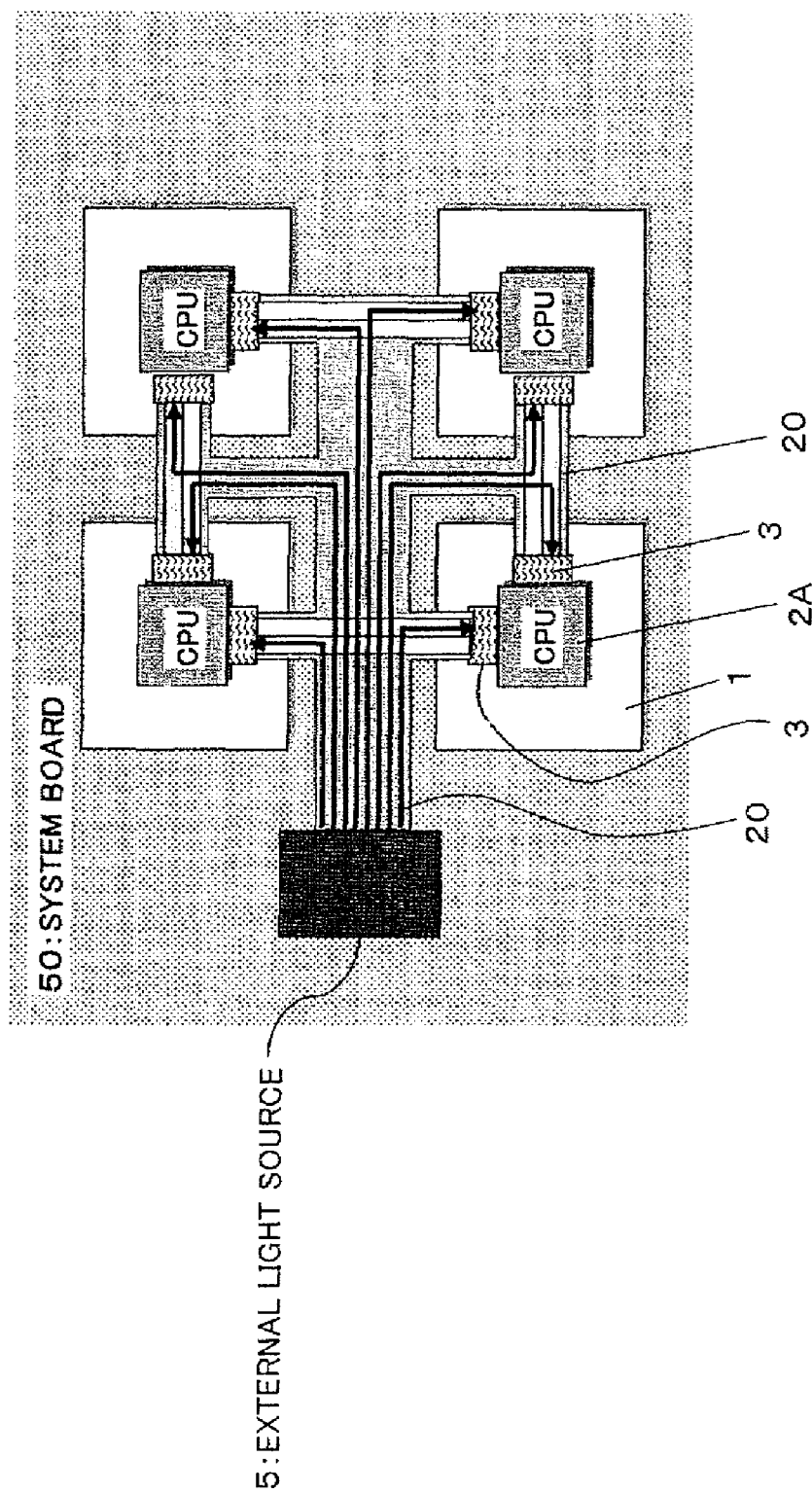
FIG. 11 is a schematic view showing an example of a configuration of the optical interconnection where a plurality of CPU chip modules as the semiconductor chip module according to the first embodiment are connected.

As shown in FIG. 11, a second example of a configuration is a configuration example where a plurality of (here, four) CPUs 2A are optically connected to each other.

In the configuration example, as shown in FIG. 11, a plurality of (here, four) CPU modules are prepared as the semiconductor chip module according to the embodiment described above, and are connected to each other using an optical fiber array 20 (for example, an optical fiber sheet) but also to an external light source 5 and are mounted on one system board 50. It is to be noted that, in FIG. 11, only part of a region of the system board 50 is shown.

Here, each CPU module is configured as a module wherein a CPU 2A and optical transmission and reception devices 3 each including an optical wiring transmission array, an optical wiring reception array, an optical fiber connector (for example, an MT connector) and a PD array are mounted on a package board 1.

Where a plurality of CPUs are connected to each other in this manner, the optical wiring transmission arrays and the optical wiring reception arrays are mounted in the proximity of the side faces of the CPUs 2A which configure the CPU modules. Here, since the four CPU modules are connected to each other, the optical wiring transmission arrays and the optical wiring reception arrays are mounted one by one in the proximity of the two side faces of each CPU 2A which forms one CPU module.

Here, the optical fiber arrays 20 (for example, optical fiber sheets) for supplying light from the external light source 5 to the CPU modules and the optical fiber arrays 20 (for example, optical fiber sheets) for connecting the CPUs 2A to each other are laminated (integrated) to form the optical supplying system.

Further, here, a high-speed transmission line between the CPUs 2A is formed as an optical connection, and the other connections to a power supply, the ground, a different device and so forth are formed from electrical connections by electric wirings in the board.

It is to be noted that the configuration, operation and so forth of the other part are similar to those of the first configuration example described hereinabove.

Third Example of a Configuration

Figure 12:
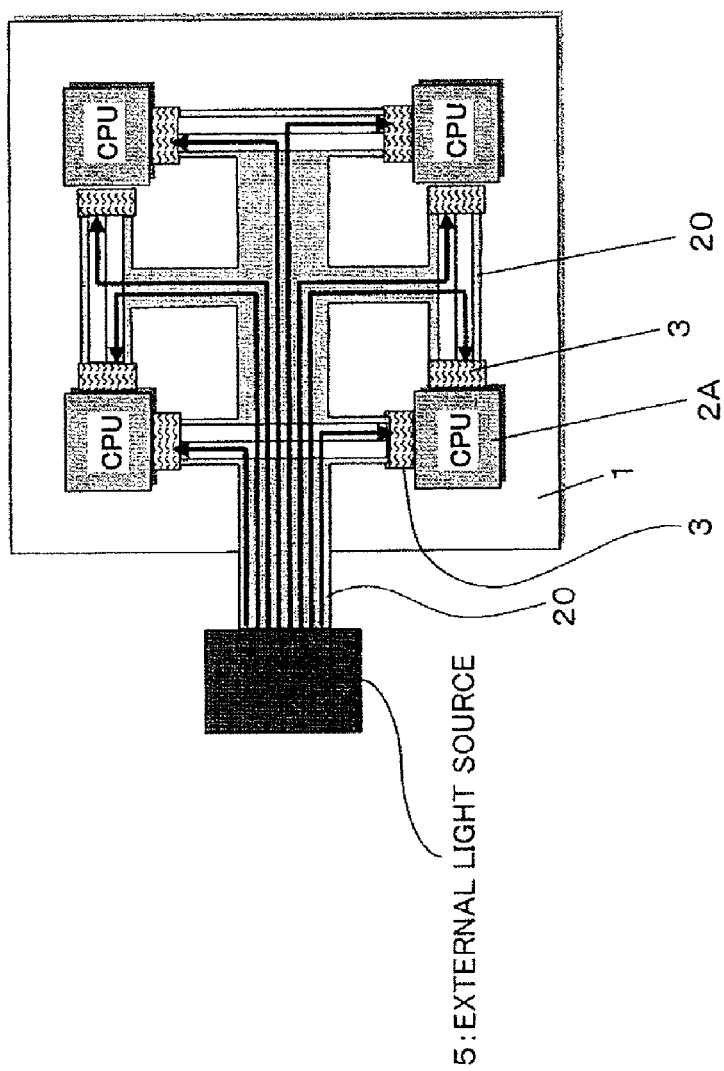
FIG. 12 is a schematic view showing an example of a configuration of an optical interconnection in a multi-chip module wherein a plurality of CPU chip modules as the semiconductor chip module according to the first embodiment are connected.

As shown in FIG. 12, a third configuration example is an example of a configuration where the configuration of the second configuration example described above is changed into a multi-chip module (MCM).

In the present configuration example, as shown in FIG. 12, as the semiconductor chip module according to the embodiment described above, a plurality of (here, four) CPUs 2A are mounted on one common package board and are connected to each other using optical fiber arrays 20 (for example, optical fiber sheets).

Where a plurality of CPUs 2A are connected to each other in this manner, an optical transmission and reception device 3 including an optical wiring transmission array, an optical wiring reception array, an optical fiber connector and a PD array is mounted in the proximity of a side face of each of the CPUs 2A. Here, since the four CPUs 2A are connected to each other, the optical transmission and reception devices 3 are mounted one by one in the proximity of the two side faces of each one CPU 2A.

It is to be noted that the configuration, operation and so forth of the other part are similar to those of the first configuration example and the second configuration example described hereinabove.

If the semiconductor chip module is configured as a multi-chip module in this manner, then there is an advantage that refinement of electric wirings and reduction of the wiring length can be implemented and the overall size can be reduced.

Second Embodiment

Now, a semiconductor chip module according to a second embodiment is described with reference to FIG. 13.

Figure 13:
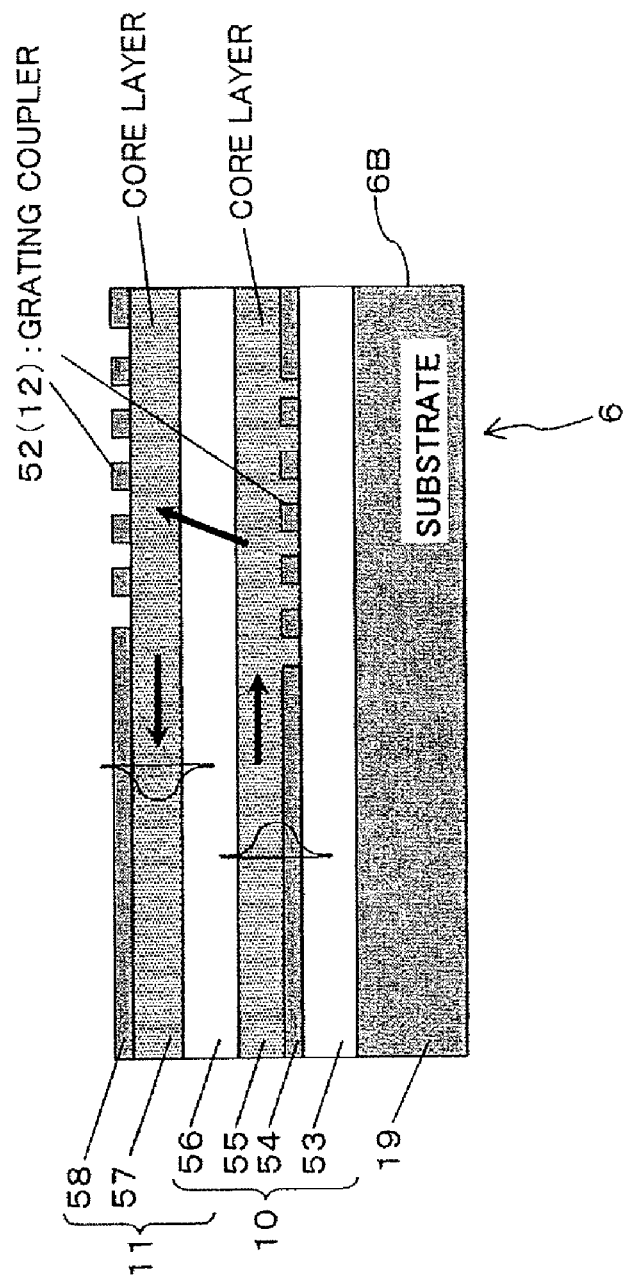
FIG. 13 is a schematic sectional view showing an optical waveguide device which composes a semiconductor chip module according to a second embodiment.

As shown in FIG. 13, the semiconductor chip module according to the present embodiment is different from the semiconductor chip module according to the first embodiment described hereinabove in that a grating coupler 52 is used as a light advancing direction conversion structure (optical path changeover structure) 12 of a transmission optical waveguide device 6.

Therefore, the present semiconductor chip module is different in the optical waveguide structure of the transmission optical waveguide device 6.

In particular, in the present embodiment, the optical waveguide structure of the transmission optical waveguide device 6 has a structure formed by laminating a first cladding layer 53, a first grating layer 54, a first core layer 55, a second cladding layer 56, a second core layer 57 and a second grating layer 58 in order on an optical waveguide substrate 19 as shown in FIG. 13. It is to be noted that part of a region in the proximity of a device end face 6B of the transmission optical waveguide device 6 on the semiconductor chip side is shown in FIG. 13.

Here, an input optical waveguide 10 to which light from an external light source is inputted is formed from the first cladding layer 53, first grating layer 54, first core layer 55 (waveguide core) and second cladding layer 56, and an output optical waveguide 11 for outputting an optical signal to a different device is formed from the second cladding layer 56, second core layer 57 (waveguide core) and second grating layer 58.

Particularly, in the present embodiment, the input optical waveguide 10 and the output optical waveguide 11 are configured in an upper and lower two-layer structure and are connected to each other in a region in the proximity of the device end face 6B on the semiconductor chip side through the grating coupler 52.

In particular, the waveguide core 55 of the input optical waveguide 10 and the waveguide core 57 of the output optical waveguide 11 are provided in parallel at positions (different positions) displaced in the thicknesswise direction of the semiconductor chip (in a direction perpendicular to the board surface). Further, in the first grating layer 54 of the input optical waveguide 10 and the second grating layer 58 of the output optical waveguide 11, gratings are provided in a waveguide core proximity region in the proximity of the device end face positioned in the proximity of the semiconductor chip. Consequently, the input optical waveguide 10 and the output optical waveguide 11 are connected to each other in the region in the proximity of the device end face 6B through the grating coupler 52.

Here, the gratings can be formed by periodically varying the refractive index along the waveguide core (optical waveguide) so as to have a periodical structure of the refractive index with respect to an advancing direction of light.

It is to be noted that, as the grating coupler 52, a grating coupler disclosed, for example, in Transactions of The Institute of Electronics, Information and Communication Engineers C-I, Vol. J80-C-I, No. 10, pp. 461-468 (1997) can be used, the contents thereof being hereby incorporated by reference.

Where such a configuration as described above is adopted, light propagated through the input optical waveguide 10 in the lower layer shifts to the output optical waveguide 11 in the upper layer through the grating coupler 52 and then propagates along the output optical waveguide 11 in the opposite direction.

In this manner, in the present embodiment, coupling of waveguide light and radiation light by the grating coupler 52 is utilized to implement shift of light between the multi-layer optical waveguides 10 and 11 (changeover between optical paths), and the advancing direction of light (propagation direction of light) propagated through the input optical waveguide 10 is converted so that the advancing direction of light which propagates in the output optical waveguide 11 is opposite to the advancing direction of light which propagates in the input optical waveguide 10. Therefore, after light from the external light source is guided once to a position in the proximity of the semiconductor chip and modulated in the proximity of the semiconductor chip, the modulated optical signal can be transmitted toward a different device. Consequently, optical systems necessary for an optical interconnection can be mounted in a high density in the proximity of the semiconductor chip on the board (package board) on which a semiconductor chip such as an LSI is mounted.

Therefore, in the present embodiment, the optical path changeover structure (light advancing direction conversion structure) 12 includes the grating coupler 52 provided in the proximity of the device end face 6B of the input optical waveguide 10 and the output optical waveguide 11 on the semiconductor chip side and is configured such that light guided through the input optical waveguide 10 is guided to the output optical waveguide 11 by the grating coupler 52.

It is to be noted that, since reflection on the device end face is not utilized in the present embodiment, the working accuracy of the device end face can be moderated in comparison with that in the case of the first embodiment described hereinabove. Further, the end portions of the optical waveguides need not be exposed on the device end face.

Figure 14:
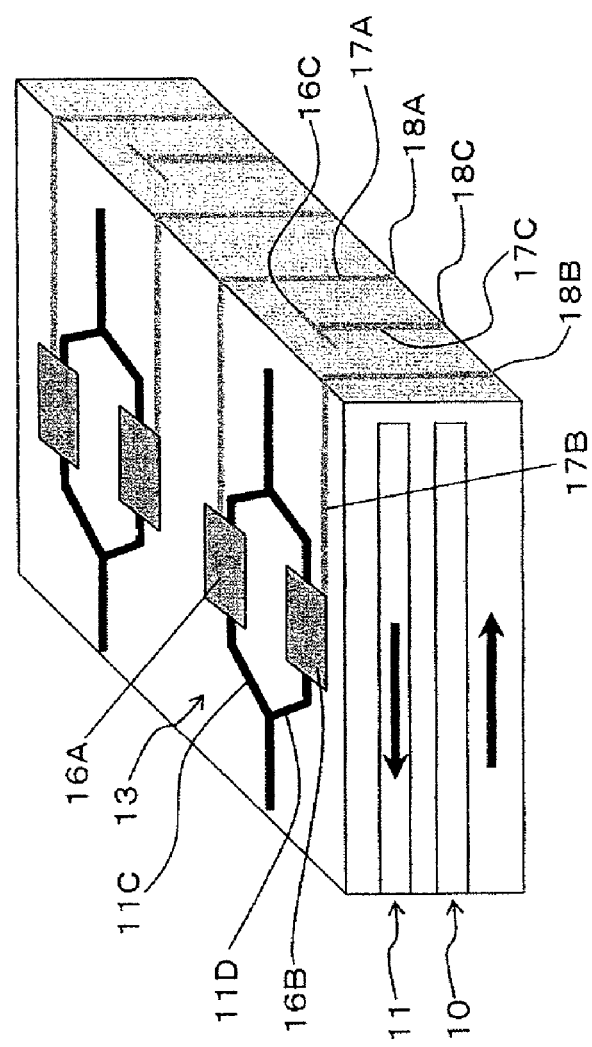
FIG. 14 is a schematic perspective view showing a configuration of the optical waveguide device which composes the semiconductor chip module according to the second embodiment.
Figure 15A:
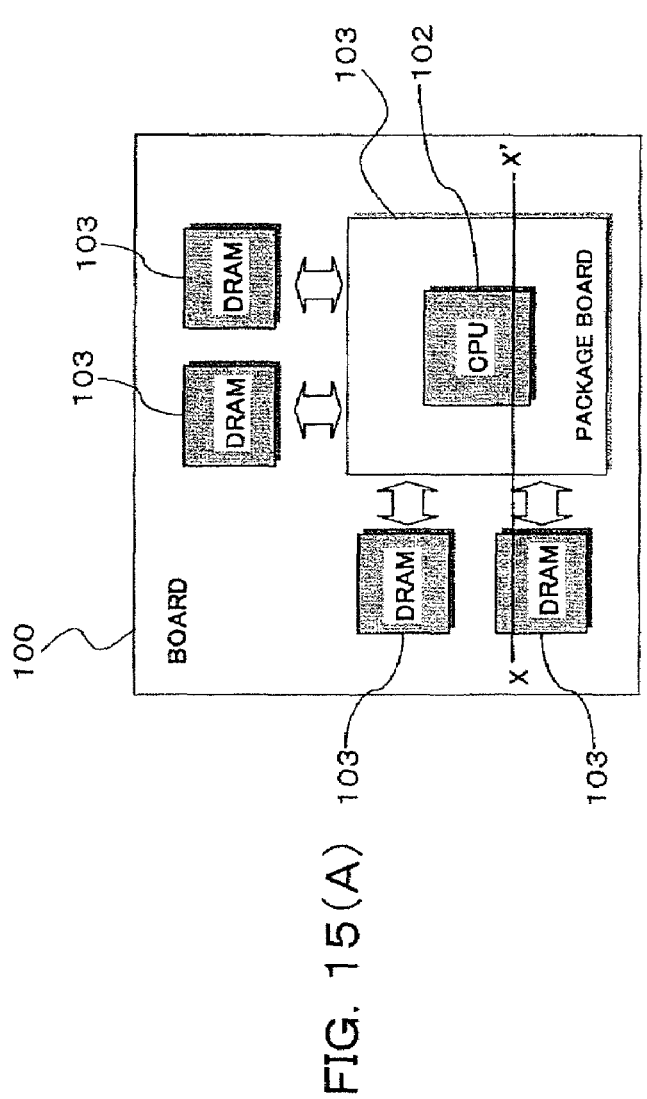
FIG. 15(A) is a schematic top plan view showing a conventional semiconductor chip module wherein a CPU and a DRAM are connected by an electric wiring.
Figure 15B:
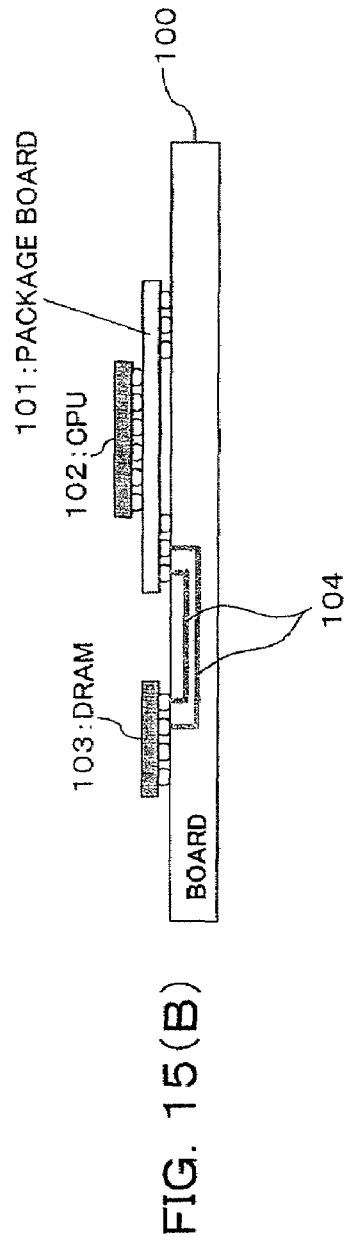
FIG. 15(B) is a sectional view taken along line X-X' of FIG. 15(A).

Incidentally, since the two-layer structure formed by stacking the input optical waveguide 10 and the output optical waveguide 11 in such a manner as described above is applied in the present embodiment, in order to simplify formation of electrodes of the optical modulator, it is preferable to provide the input optical waveguide 10 on the lower side and provide the output optical waveguide 11 on the upper side and besides provide the optical modulator 13 on the output optical waveguide 11 on the upper side as shown in FIG. 14.

Further, in the present embodiment, by forming the input optical waveguide 10 and the output optical waveguide 11 in a stacked relationship as described above, the waveguide core of the input optical waveguide 10 and the waveguide core of the output optical waveguide 11 are provided in parallel at positions (different positions) displaced in the thicknesswise direction of the semiconductor chip (in a direction perpendicular to the board surface). Therefore, a plurality of transmission optical waveguide devices 6 are formed integrally on the same substrate 19 and are mounted on the package board 1 as they are in a state wherein the optical waveguide substrate 19 is faced downwardly. In this instance, the optical wiring transmission array is formed on the same substrate 19. Further, the plural transmission optical waveguide devices 6 are formed as part of the optical wiring transmission array.

In this instance, since a Mach-Zehnder type optical modulator 13 is formed similarly as in the first embodiment described above, the two optical waveguide arms 11C and 11D of the Mach-Zehnder type optical modulator 13 are juxtaposed in a parallel direction on the surface of the optical waveguide substrate 19. Here, by displacing the position of the Mach-Zehnder type optical modulator 13 in a longitudinal direction of the optical waveguide between the transmission optical waveguide devices 6 adjacent to each other, the transmission optical waveguide devices 6 can be mounted in a still higher density. It is to be noted that the Mach-Zehnder type optical modulator may be formed such that the two optical waveguide arms 11C and 11D are juxtaposed in a vertical direction on the surface of the optical waveguide substrate 19.

Further, the lead wirings (electric wirings) 17A to 17C individually connected to the electrodes (modulation electrodes 16A and 16B, ground electrode 16C) extend from the electrodes 16A to 16C of the optical modulator 13 to the back face side of the optical waveguide substrate 19 through the surface of the device end face 6B of the transmission optical waveguide device 6 positioned in the proximity of the semiconductor chip, and the electrode pads 18A to 18C are formed at tip ends of the lead wirings 17A to 17C, respectively.

On the other hand, also a plurality of reception optical waveguide devices 7 are formed integrally on the same substrate 19 similarly to the transmission optical waveguide devices 6 described above. In this instance, the optical wiring reception array is formed on the same substrate 19. Further, the plural reception optical waveguide devices 7 are formed as part of the optical wiring reception array. While, on each transmission optical waveguide device 6 described above, two optical waveguides are formed upwardly and downwardly, on the reception optical waveguide device 7, at least only a reception input optical waveguide may be formed.

Particularly, the reception input optical waveguide is preferably formed as an optical waveguide having an inclined waveguide portion (for example, a curved waveguide portion) inclined in a parallel direction (horizontal direction) to the surface of the optical waveguide substrate 19 in the proximity of the device end face on the semiconductor chip side so that light propagated through the reception input optical waveguide may not be reflected on the device end face 6B (PD light reception face) and act as returning light which provides a bad influence.

Further, also it is preferable to provide an optical waveguide for processing a reflection light similarly as in the first embodiment described above. In particular, also it is preferable to provide an optical waveguide for processing a reflection light in parallel at a position (different position) displaced in a parallel direction (horizontal direction) to the surface of the optical waveguide substrate 19 with respect to the reception input optical waveguide. In this instance, if the optical waveguide for processing a reflection light is terminated immediately in the proximity of the device end face, then the distance between the individual reception input optical waveguides can be reduced and the reception optical waveguide devices 7 can be mounted in a still higher density.

It is to be noted that the configuration and the operation of the other part are similar to those in the first embodiment described above.

Accordingly, with the semiconductor chip module according to the present embodiment, there is an advantage that an optical interconnection whose size is reduced so that a large number of components can be mounted in a high density in the proximity of a semiconductor chip (for example, an LSI) can be implemented while the cost is suppressed low similarly to the first embodiment described hereinabove.

[Others]

It is to be noted that, while, in the embodiments described above, a light reflection structure or a grating coupler is used as the light advancing direction conversion structure (optical path changeover structure) of a transmission optical waveguide device 6, the light advancing direction conversion structure is not limited to the configurations described above, but a different configuration may be used if it has a structure for guiding light guided through the input optical waveguide 10 to the output optical waveguide 11.

Further, the present invention is not limited to the embodiments described above, and variations and modifications can be made without departing from the scope of the present invention.

What is claimed is:

1. A semiconductor chip module, comprising:
   a semiconductor chip mounted on a circuit board; and
   a transmission optical waveguide device for transmitting a light signal obtained by modulating light from an external light source to a different device;
   said transmission optical waveguide device including:
   an input optical waveguide to which the light from said external light source is inputted;
   an output optical waveguide, provided at a position displaced in a direction perpendicular to the surface of said circuit board in a mounted state on said circuit board with respect to said input optical waveguide, outputting an optical signal to the different device;
   an optical path changeover structure for guiding the light guided through said input optical waveguide to said output optical waveguide; and
   an optical modulator, provided at said input optical waveguide or said output optical waveguide, modulating the light from said external light source based on an electric signal from said semiconductor chip;
   further comprising:
   a reception optical waveguide device including a reception input optical waveguide guiding the optical signal from the different device to an end face thereof on said semiconductor chip side; and
   a photoelectric conversion device, mounted on said circuit board so as to be connected to said reception optical waveguide, converting the optical signal into an electric signal,
   wherein said transmission optical waveguide device and said reception optical waveguide device are provided in a juxtaposed relationship in a direction parallel to the surface of said circuit board.

2. The semiconductor chip module as claimed in claim 1, wherein said input optical waveguide and said output optical waveguide extend to an end face of said transmission optical waveguide device on said semiconductor chip side, and
   said optical path changeover structure includes a light reflection surface of the end face of said transmission optical waveguide device, an inclination waveguide portion of said input optical waveguide and an inclination waveguide portion of said output optical waveguide connected to said inclination waveguide portion of said input optical waveguide through said light reflection surface, and is configured such that the light guided through said inclination waveguide portion of said input optical waveguide is reflected on said light reflection surface and is guided to said inclination waveguide portion of said output optical waveguide.

3. The semiconductor chip module as claimed in claim 1, wherein said optical path changeover structure includes a grating coupler provided in the proximity of an end face of said transmission optical waveguide device on said semiconductor chip side on said input optical waveguide and said output optical waveguide, and is configured such that the light guided through said input optical waveguide is guided to said output optical waveguide by said grating coupler.

4. The semiconductor chip module as claimed in claim 1, wherein said reception optical waveguide device includes an optical waveguide for processing a reflection light, connected to said reception input optical waveguide, having a light absorption structure absorbing light reflected on the end face of said reception optical waveguide device.

5. The semiconductor chip module as claimed in claim 1, wherein said reception optical waveguide device includes an optical waveguide provided at a position displaced in a direction perpendicular to the surface of said circuit board in a mounted state on said circuit board with respect to said reception input optical waveguide.

6. The semiconductor chip module as claimed in claim 1, wherein said transmission optical waveguide device is comprised of a plurality of transmission optical waveguide devices, and
   the plural transmission optical waveguide devices are provided in a juxtaposed relationship in a direction parallel to the surface of said circuit board.

7. The semiconductor chip module as claimed in claim 6, further comprising a common light source capable of supplying light individually to the plural transmission optical waveguide devices as said external light source.

8. The semiconductor chip module as claimed in claim 1, wherein said reception optical waveguide device is comprised of a plurality of reception optical waveguide devices, and
   the plural reception optical waveguide devices are provided in a juxtaposed relationship in a direction parallel to the surface of said circuit board.

9. The semiconductor chip module as claimed in claim 1, wherein said transmission optical waveguide device includes an electric wiring which extends from an electrode of said optical modulator to a bottom face of said transmission optical waveguide device in a mounted state on said circuit board and an electrode pad which is formed on the bottom face and to which said electric wiring is connected, and is connected to said electric wiring formed on said circuit board through said electrode pad so as to be electrically connected to said semiconductor chip.

10. The semiconductor chip module as claimed in claim 1, wherein said optical modulator is formed from a material capable producing an electro-optical effect.

11. The semiconductor chip module as claimed in claim 1, wherein said transmission optical waveguide device is a polymer optical waveguide device.

12. The semiconductor chip module as claimed in claim 1, wherein said reception optical waveguide device is a polymer optical waveguide device.

13. A semiconductor chip module, comprising:
  said semiconductor chip module as claimed in claim 1 being comprised of a plurality of semiconductor chip modules;
  said plural semiconductor chip modules being connected to each other by an optical fiber.

14. The semiconductor chip module as claimed in claim 1, wherein said semiconductor chip is comprised of a plurality of semiconductor chips, said transmission optical waveguide device is comprised of a plurality of transmission optical waveguide devices, and said plural semiconductor chips and said plural transmission optical waveguide devices are provided on said circuit board.

15. The semiconductor chip module as claimed in claim 14, wherein said reception optical waveguide device is comprised of a plurality of reception optical waveguide devices, and said plural reception optical waveguide devices are provided on said circuit board.

16. A semiconductor chip module, comprising:
  a semiconductor chip mounted on a circuit board; and
  a transmission optical waveguide device for transmitting a light signal obtained by modulating light from an external light source to a different device;
  said transmission optical waveguide device including:
  an input optical waveguide to which the light from said external light source is inputted;
  an output optical waveguide, provided at a position displaced in a direction perpendicular to the surface of said circuit board in a mounted state on said circuit board with respect to said input optical waveguide, outputting an optical signal to the different device;
  an optical path changeover structure for guiding the light guided through said input optical waveguide to said output optical waveguide; and
  an optical modulator, provided at said input optical waveguide or said output optical waveguide, modulating the light from said external light source based on an electric signal from said semiconductor chip;
further comprising:
a reception optical waveguide device including a reception input optical waveguide guiding the optical signal from the different device to an end face thereof on said semiconductor chip side; and
a photoelectric conversion device, mounted on said circuit board so as to be connected to said reception optical waveguide, converting the optical signal into an electric signal,
wherein said photoelectric conversion device is mounted on said circuit board through a wiring block having an electric wiring so as to be electrically connected to said semiconductor chip.

17. A semiconductor chip module, comprising:
  said semiconductor chip module as claimed in claim 16 being comprised of a plurality of semiconductor chip modules;
  said plural semiconductor chip modules being connected to each other by an optical fiber.

18. The semiconductor chip module as claimed in claim 16, wherein said semiconductor chip is comprised of a plurality of semiconductor chips, said transmission optical waveguide device is comprised of a plurality of transmission optical waveguide devices, and said plural semiconductor chips and said plural transmission optical waveguide devices are provided on said circuit board.

* * * * *